United States Patent
Takizawa

(10) Patent No.: US 12,230,322 B2
(45) Date of Patent: Feb. 18, 2025

(54) MEMORY DEVICE INCLUDING MEMORY CELL INCLUDING VARIABLE RESISTANCE ELEMENT AND SWITCHING ELEMENT

(71) Applicant: Kioxia Corporation, Tokyo (JP)

(72) Inventor: Ryousuke Takizawa, Naka Kanagawa (JP)

(73) Assignee: Kioxia Corporation, Tokyo (JP)

( * ) Notice: Subject to any disclaimer, the term of this patent is extended or adjusted under 35 U.S.C. 154(b) by 268 days.

(21) Appl. No.: 17/943,432

(22) Filed: Sep. 13, 2022

(65) Prior Publication Data

US 2023/0317155 A1 Oct. 5, 2023

(30) Foreign Application Priority Data

Mar. 18, 2022 (JP) ................. 2022-044263

(51) Int. Cl.
*G11C 11/24* (2006.01)
*G11C 13/00* (2006.01)

(52) U.S. Cl.
CPC ........ *G11C 13/004* (2013.01); *G11C 13/0038* (2013.01); *G11C 13/0069* (2013.01)

(58) Field of Classification Search
CPC .................................................. G11C 13/004
USPC ......................................................... 365/148
See application file for complete search history.

(56) References Cited

U.S. PATENT DOCUMENTS

| 2020/0312395 | A1 | 10/2020 | Takizawa |
| 2021/0082501 | A1 | 3/2021 | Lee |
| 2021/0090629 | A1 | 3/2021 | Hatsuda |
| 2021/0090645 | A1* | 3/2021 | Inaba ................. G11C 13/0004 |
| 2021/0183425 | A1 | 6/2021 | Takizawa |
| 2021/0295890 | A1 | 9/2021 | Takizawa |

FOREIGN PATENT DOCUMENTS

| JP | 2009043384 A | 2/2009 |
| JP | 2021047950 A | 3/2021 |

* cited by examiner

*Primary Examiner* — Hoai V Ho
(74) *Attorney, Agent, or Firm* — Holtz, Holtz & Volek PC

(57) ABSTRACT

A first switching element in a memory cell is configured to transition from an ON state to an OFF state in response to a voltage applied between its two terminals being decreased. A read circuit is configured to place the second interconnect in a floating state, and, after placing the second interconnect in the floating state and based on a comparison between a first voltage of the second interconnect at a time point of the first switching element becoming the OFF state and a second voltage, either apply a third voltage to the second interconnect and then place the second interconnect in the floating state, or apply a fourth voltage lower than the third voltage to the second interconnect without applying the third voltage to the second interconnect.

17 Claims, 19 Drawing Sheets

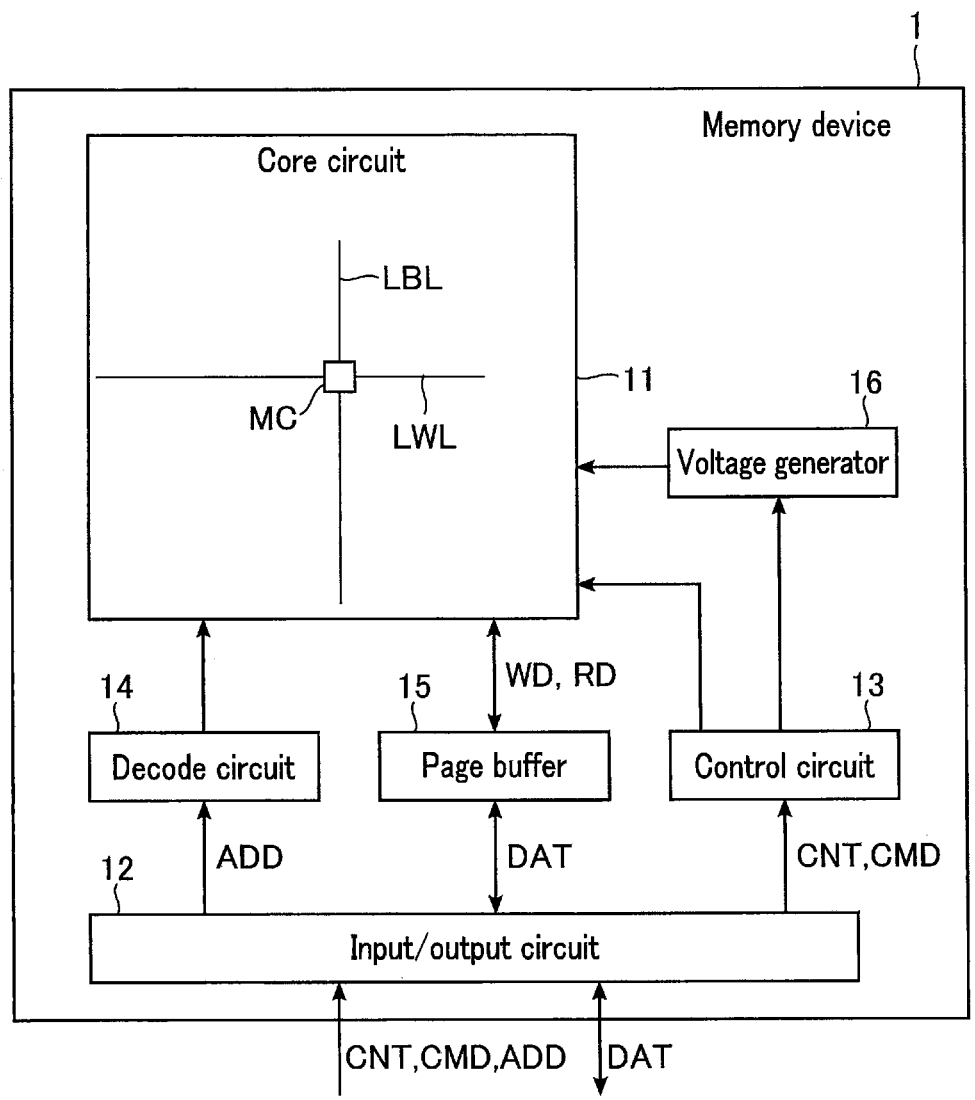
F I G. 1

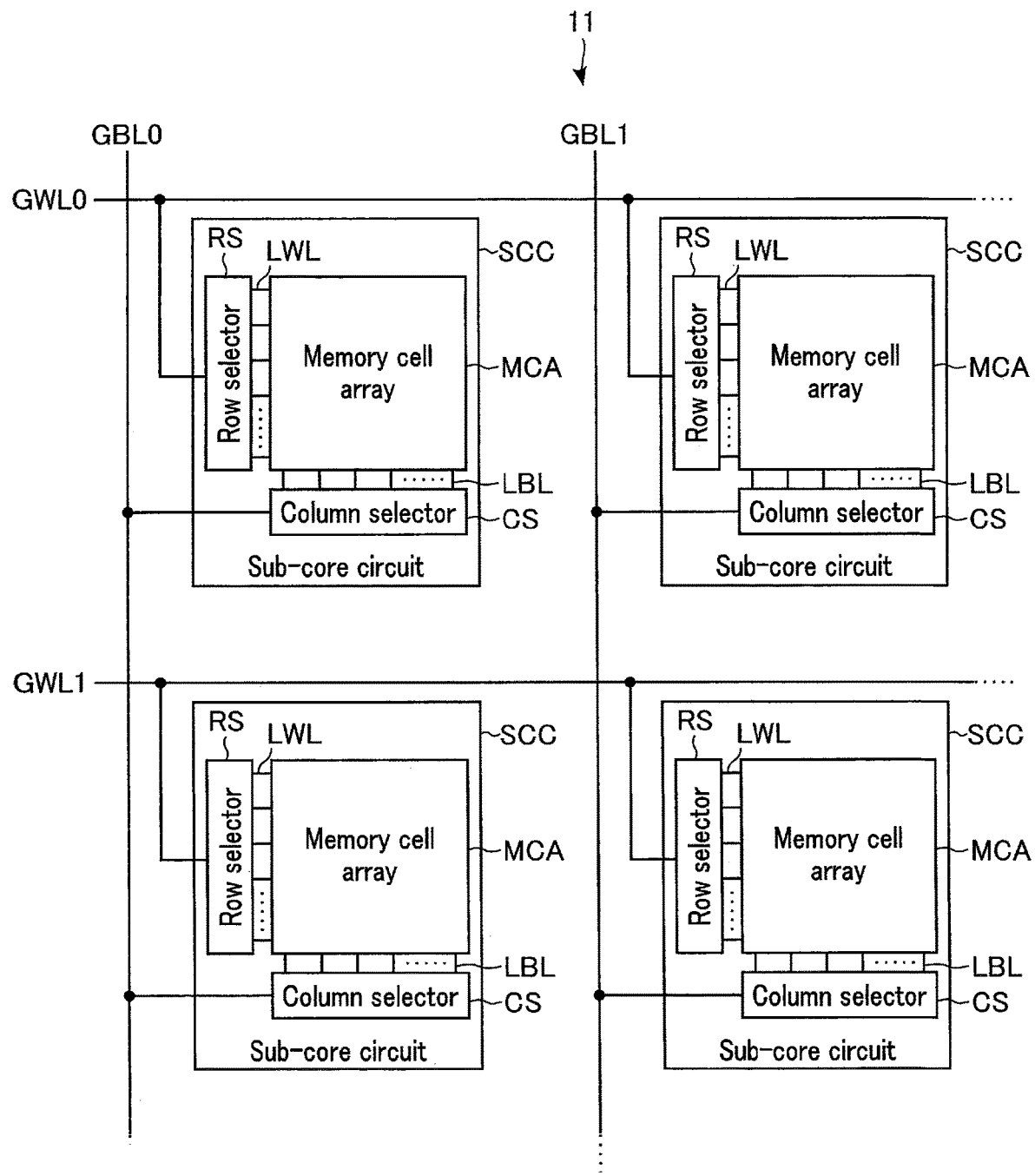
F I G. 3

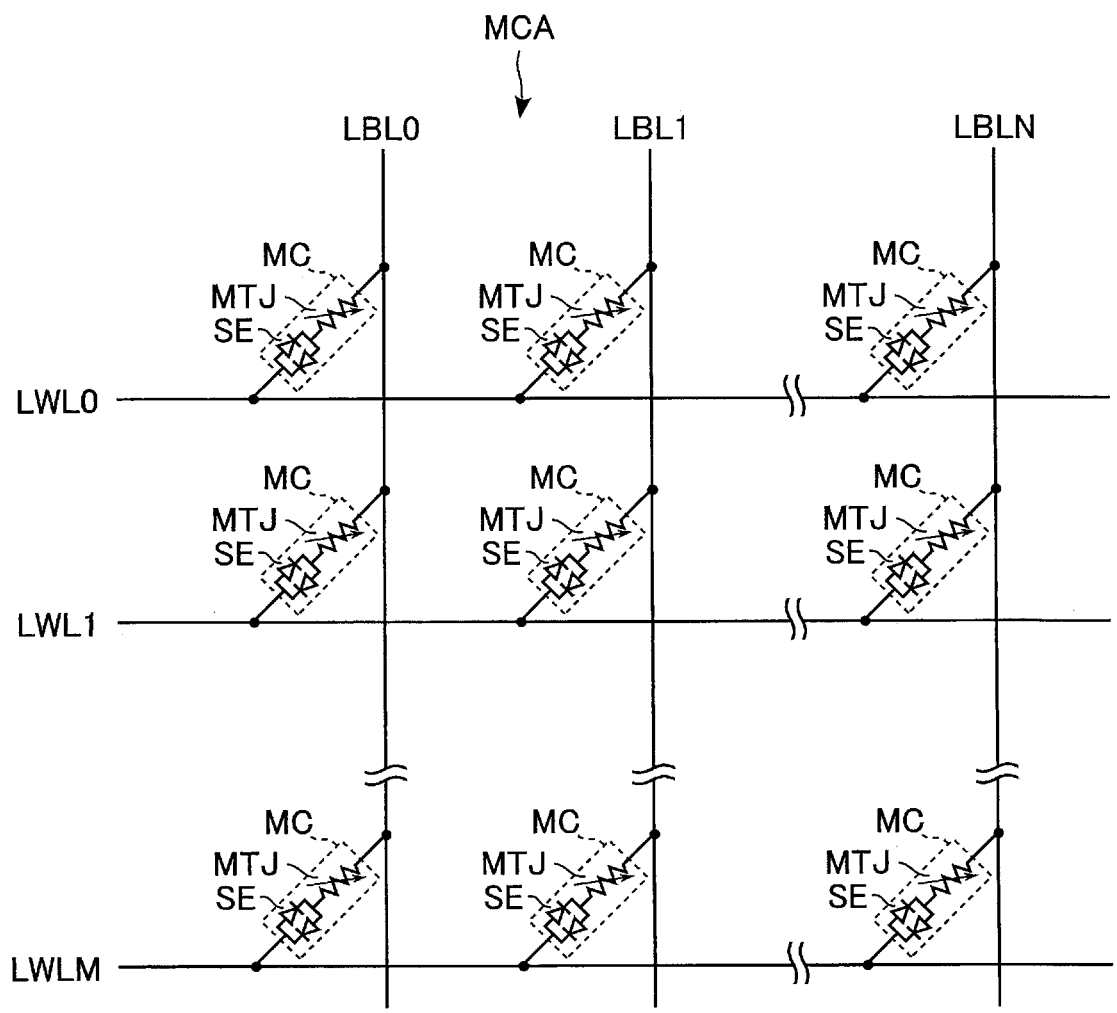
F I G. 5

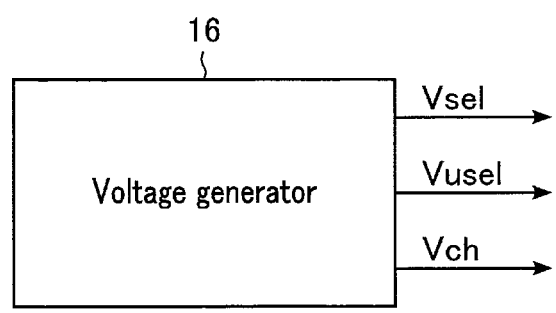
F I G. 9

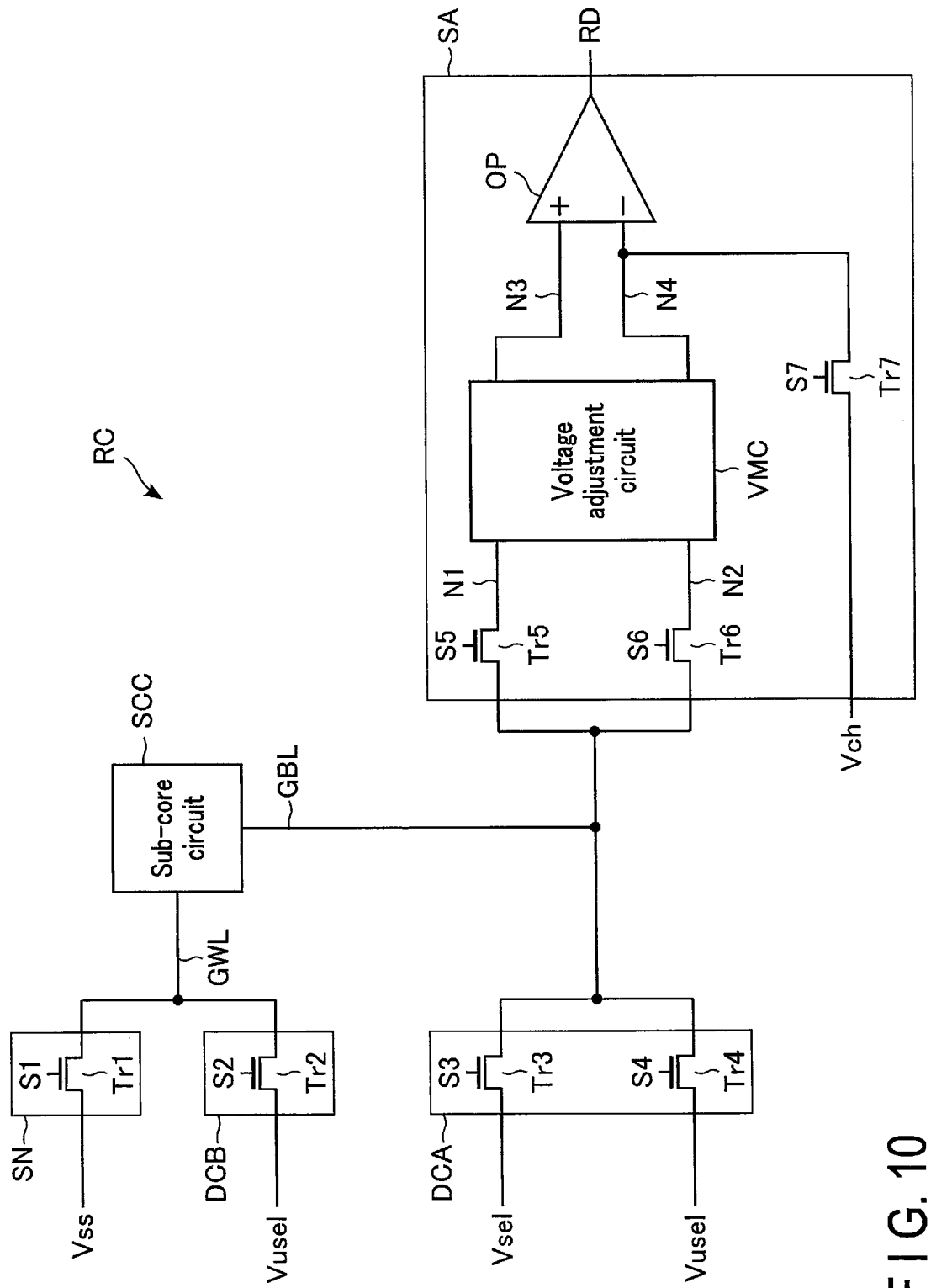
F I G. 10

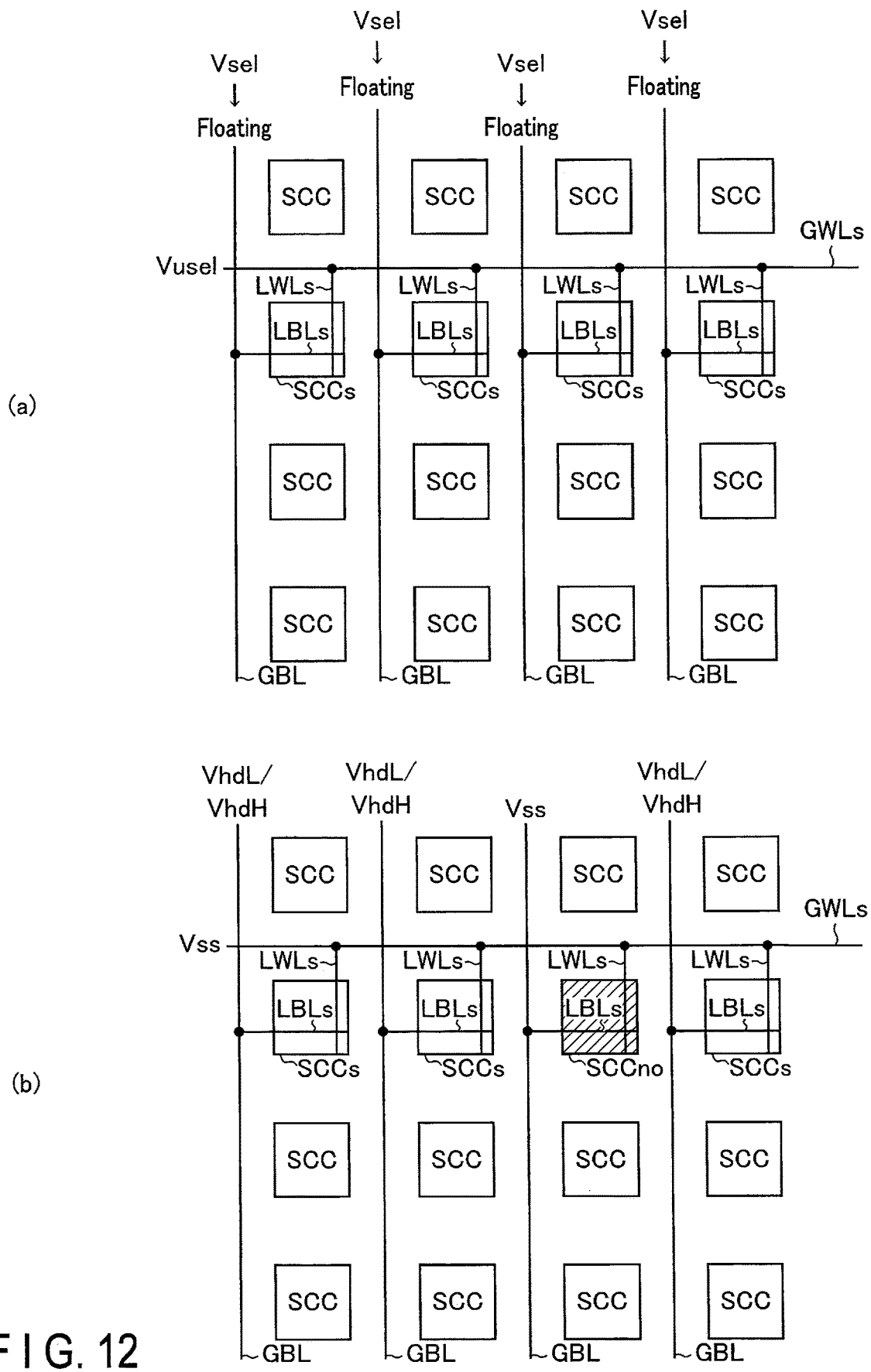
F I G. 12

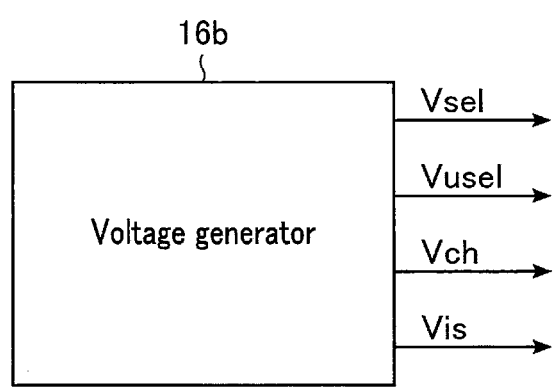
F I G. 14

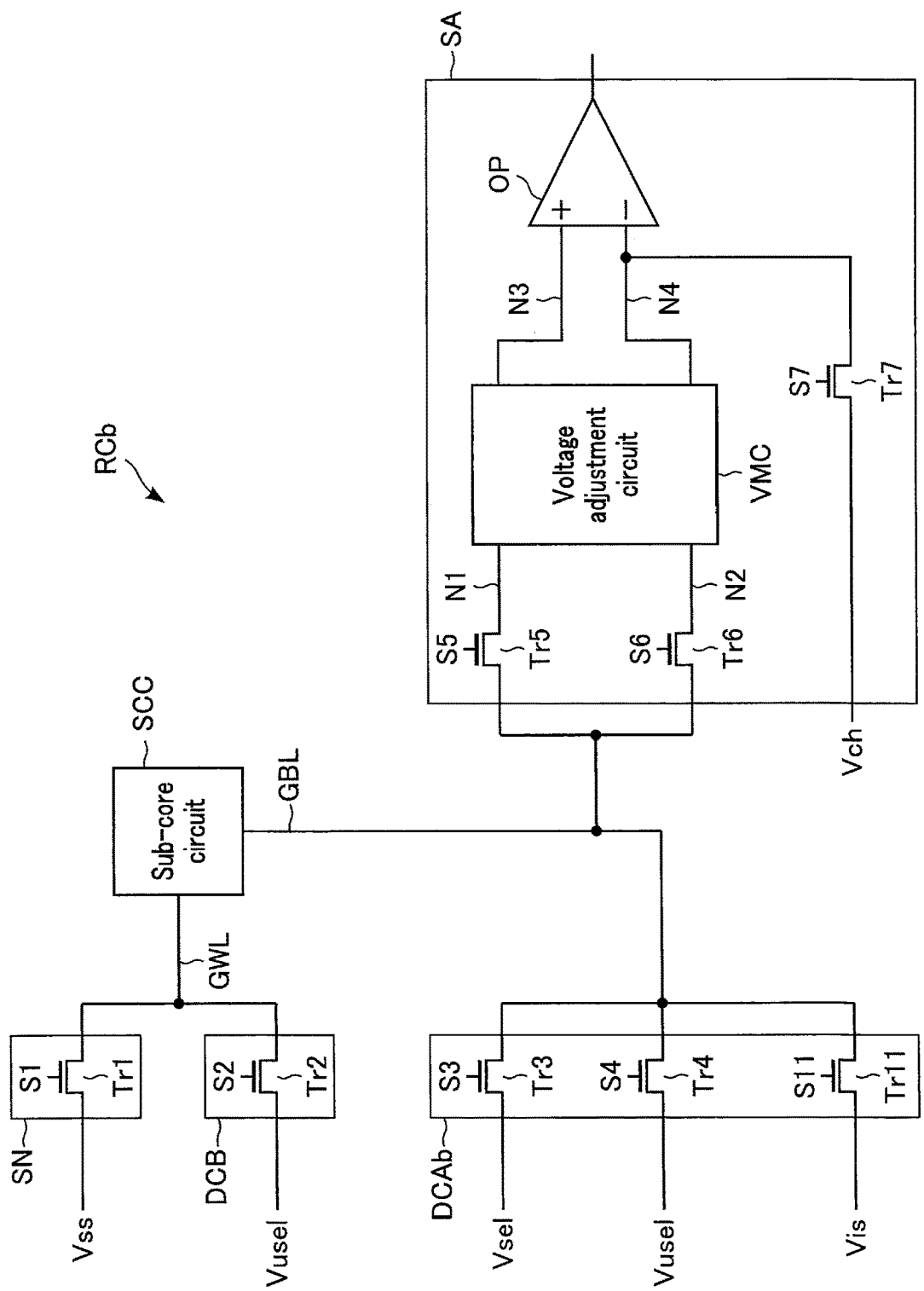
F I G. 15

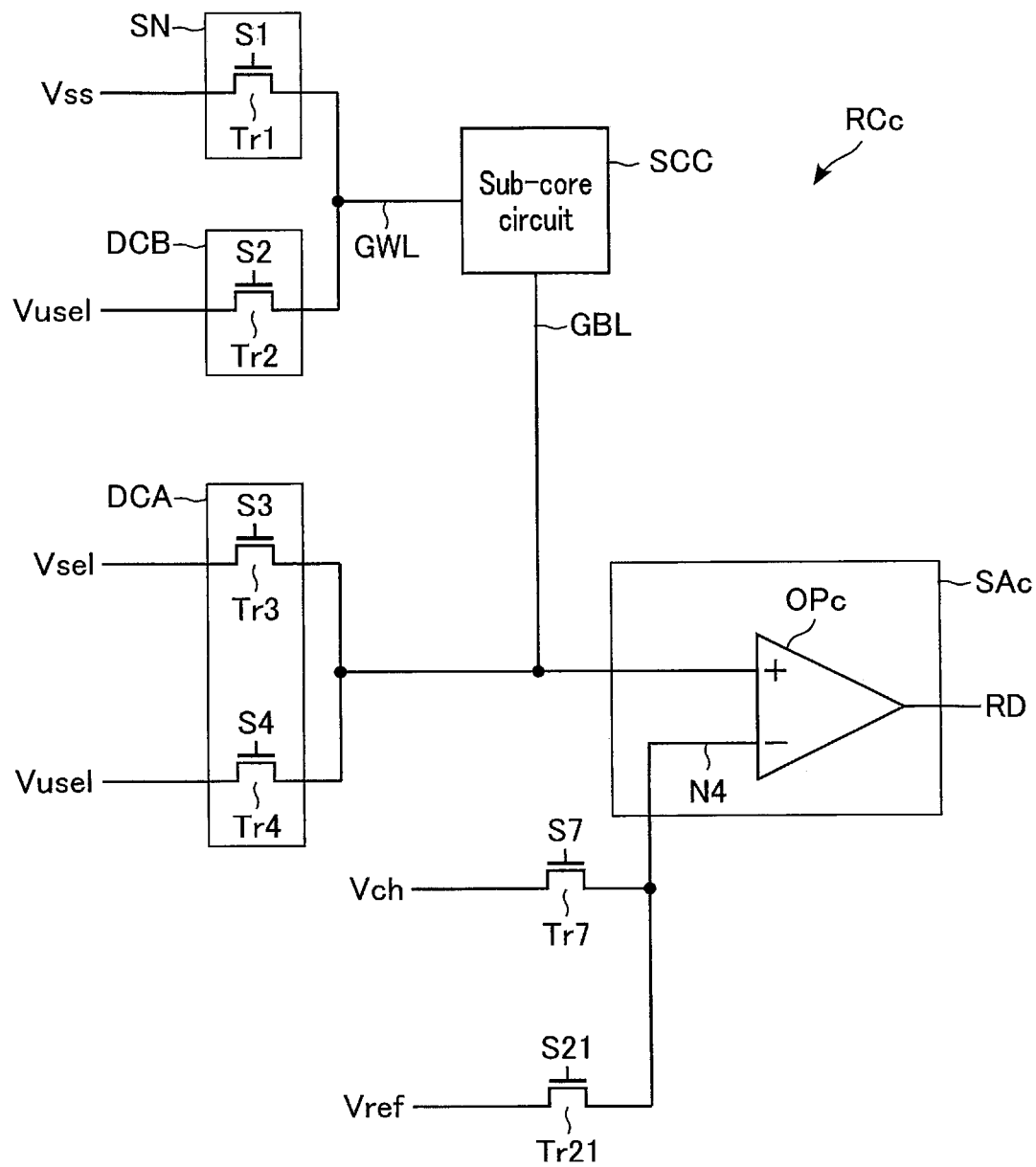
F I G. 17

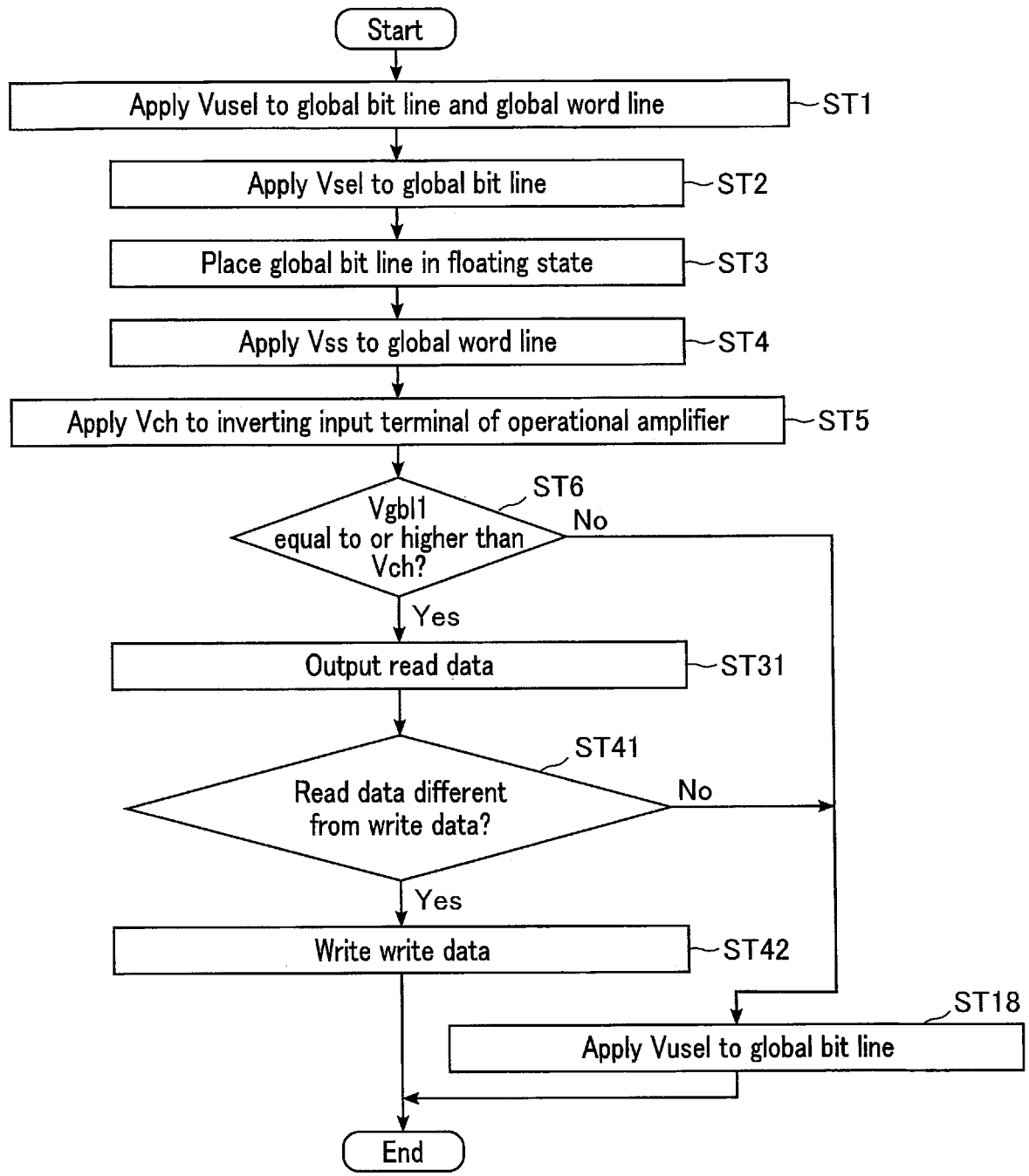
F I G. 19

MEMORY DEVICE INCLUDING MEMORY CELL INCLUDING VARIABLE RESISTANCE ELEMENT AND SWITCHING ELEMENT

CROSS-REFERENCE TO RELATED APPLICATION

This application is based upon and claims the benefit of priority from Japanese Patent Application No. 2022-044263, filed Mar. 18, 2022, the entire contents of which are incorporated herein by reference.

FIELD

Embodiments described herein relate generally to a memory device.

BACKGROUND

A memory device in which data is stored using an element having a dynamically variable resistance is known. It is desirable that a memory device be operable even with a few local defects.

BRIEF DESCRIPTION OF THE DRAWINGS

FIG. 1 shows functional blocks of a memory device according to a first embodiment.

FIG. 3 shows functional blocks and interconnects of a part of the core circuit according to the first embodiment.

FIG. 5 is a circuit diagram of a memory cell array according to the first embodiment.

FIG. 9 shows types of voltages output from a voltage generator according to the first embodiment.

FIG. 10 shows details of a read circuit according to the first embodiment.

FIG. 12 conceptually shows a partial layout of the memory device according to the first embodiment, as well as its state transition during the operation.

FIG. 14 shows types of voltages output from a voltage generator according to a second embodiment.

FIG. 15 shows details of a read circuit according to the second embodiment.

FIG. 17 shows details of a read circuit according to a third embodiment.

FIG. 19 shows a flow of a data read operation with a memory device according to a fourth embodiment.

DETAILED DESCRIPTION

Figure 2:
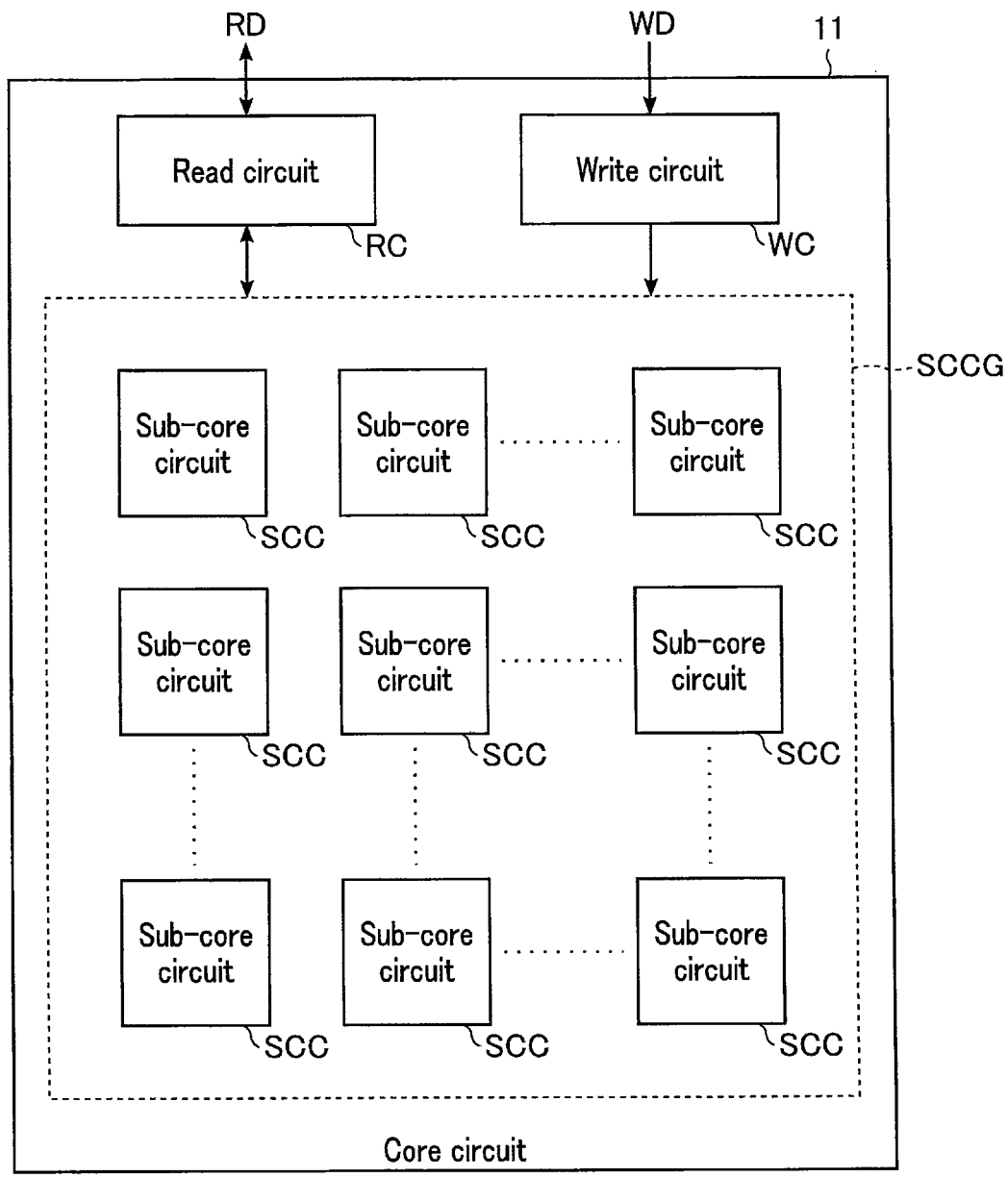
FIG. 2 shows functional blocks of a core circuit according to the first embodiment.

In general, according to one embodiment, a memory device comprising includes a first interconnect, a second interconnect, a first memory cell between the first interconnect and the second interconnect, and a read circuit. The first memory cell includes a first variable resistance element and a first switching element. The first switching element is configured to transition from an ON state to an OFF state in response to a voltage applied between two terminals of the first switching element being decreased. The read circuit is configured to place the second interconnect in a floating state. The read circuit is configured to, after placing the second interconnect in the floating state and based on a comparison between a first voltage of the second interconnect at a time point of the first switching element becoming the OFF state and a second voltage, either apply a third voltage to the second interconnect and then place the second interconnect in the floating state, or apply a fourth voltage lower than the third voltage to the second interconnect without applying the third voltage to the second interconnect.

For distinction between components or features having substantially the same functions and configurations in an embodiment or in different embodiments, the description will add a numeral or a character to the end of their respective reference signs. For an embodiment subsequent to an embodiment that has already been described, the description will concentrate mainly on the matters that constitute a difference from the already described embodiment. The entire description of a particular embodiment applies to another embodiment unless an explicit mention is made otherwise, or an obvious elimination is involved.

Each functional block may be implemented as hardware, computer software, or their combination. Some of the functions may be implemented by functional blocks different from those illustrated below. Furthermore, an illustrated functional block may be divided into functional sub-blocks.

Steps in the flow of a method according to an embodiment are not limited to any of the illustrated orders, and may occur in an order different from the illustrated orders and/or may occur concurrently with another step or steps.

The specification and the claims, when mentioning that a particular (first) component is "coupled" to another (second) component, intend to cover both the form of the first component directly coupled to the second component and the form of the first component coupled to the second component via one or more components which are always or selectively conductive.

1. First Embodiment 1.1. Structure (Configuration)

1.1.1. Overall Configuration

FIG. 1 shows functional blocks of a memory device 1 according to the first embodiment. The memory device 1 is a device adapted to store data. The memory device 1 stores data using a material or materials showing a variable resistance. The memory device 1 includes one or more core circuits 11 (only one core circuit 11 shown), an input/output circuit 12, a control circuit 13, a decode circuit 14, a page buffer 15, and a voltage generator 16.

The core circuit 11 is a circuitry component including memory cells MC, interconnects for accessing the memory cells MC, and peripheral circuits. Each memory cell MC is an element to store data in a nonvolatile manner. The interconnects include global word lines GWL (not shown in the figure), local word lines LWL, global bit lines GBL (not shown in the figure), and local bit lines LBL. Each memory cell MC is coupled to one local word line LWL and one local bit line LBL. Each local word line LWL is assigned one row address. Each local bit line LBL is assigned one column address.

The input/output circuit 12 is a circuit to conduct input and output of data and signals. The input/output circuit 12 receives, from outside the memory device 1, e.g., a memory controller, various datasets including a control signal CNT, a command CMD, an address signal ADD, and data DAT to be written in the memory cells MC. The data DAT to be written in the memory cells MC may be called write data WD. The input/output circuit 12 sends the data DAT read from the memory cells MC to the outside of the memory device 1. The data DAT read from the memory cells MC may be called read data RD.

The control circuit 13 is a circuit which takes control over operations of the memory device 1. The control circuit 13 receives the command CMD and the control signal CNT from the input/output circuit 12. The control circuit 13 controls the core circuit 11 according to instructions conveyed by the command CMD and the control signal CNT so that reading of data from the memory cells MC and writing of data in the memory cells MC are controlled. The control circuit 13 controls the voltage generator 16 according to instructions conveyed by the command CMD and the control signal CNT.

The decode circuit 14 is a circuit to decode the address signal ADD. The decode circuit 14 receives the address signal ADD from the input/output circuit 12. The address signal ADD includes a pair of a row address and a column address for specifying the memory cell MC targeted for data reading or data writing. The decode circuit 14 decodes the address signal ADD and generates, based on the decoding result, a signal for selecting the memory cell MC targeted for data reading or data writing. The generated signal is sent to the core circuit 11.

The page buffer 15 is a circuit to temporarily store data of a given size. In the course of writing data in the memory cells MC, the page buffer 15 receives the write data WD from the input/output circuit 12, temporarily stores the write data WD, and transfers the write data WD to the core circuit 11. In the course of reading data from the memory cells MC, the page buffer 15 receives the read data RD from the core circuit 11, temporarily stores the read data RD, and transfers the stored read data RD to the input/output circuit 12.

The voltage generator 16 is a circuit to generate various voltages for use in the memory device 1. The voltage generator 16 generates each voltage under the control of the control circuit 13. The voltage generator 16, while writing of data to the memory cell MC is ongoing, supplies a voltage for use in the data writing to the core circuit 11. The voltage generator 16, while reading of data from the memory cell MC is ongoing, supplies a voltage for use in the data reading to the core circuit 11.

1.1.2. Configuration of Core Circuit

FIG. 2 shows functional blocks of the core circuit 11 according to the first embodiment. As shown in FIG. 2, the core circuit 11 includes a sub-core circuit group SCCG, a read circuit RC, and a write circuit WC.

The sub-core circuit group SCCG is constituted by multiple sub-core circuits SCC. Each sub-core circuit SCC is a circuit including its multiple memory cells MC, interconnects for accessing the memory cells MC, and peripheral circuits. The interconnects include local word lines LWL and local bit lines LBL. The configuration of the sub-core circuits SCC will be described in more detail later.

The read circuit RC is a circuit for controlling reading of data from the memory cells MC. The read circuit RC determines data stored in the memory cell MC targeted for data reading, from a voltage which is based on this data stored in the memory cell MC targeted for data reading. The read circuit RC includes multiple sense amplifiers SA. Each sense amplifier SA is a circuit to determine data stored in the corresponding memory cell MC targeted for data reading, from a voltage which is based on this data stored in the corresponding memory cell MC targeted for data reading. Each sense amplifier SA is adapted to output data based on a relationship in size between two voltages. The sense amplifier SA outputs, based on such a relationship in size between two voltages, the data determined to be stored in the memory cell MC targeted for data reading. The determined data is handled as the read data RD and supplied to the page buffer 15.

The write circuit WC is a circuit for controlling writing of data in the memory cells MC. The write circuit WC receives the write data WD from the page buffer 15. The write circuit WC applies a current to the memory cell MC targeted for data writing based on the write data WD so that the data is written in the memory cell MC targeted for data writing. The write circuit WC includes multiple write drivers.

FIG. 3 shows functional blocks and interconnects of a part of the core circuit 11 according to the first embodiment. FIG. 3 shows, among others, the functional blocks and the interconnects in the sub-core circuits SCC, as well as the interconnects coupled to the sub-core circuits SCC. The interconnects include multiple global word lines GWL (GWL0, GWL1, . . . ) and multiple global bit lines GBL (GBL0, GBL1, . . . ). Each global word line GWL is coupled to multiple sub-core circuits SCC. Each global bit line GBL is coupled to multiple sub-core circuits SCC. Each sub-core circuit SCC is coupled to one global word line GWL and one global bit line GBL.

The sub-core circuits SCC have the same configuration. Each sub-core circuit SCC includes a memory cell array MCA, multiple local word lines LWL, multiple local bit lines LBL, a row selector RS, and a column selector CS.

The memory cell array MCA is constituted by multiple memory cells MC disposed in a given arrangement. The multiple local word lines LWL and the multiple local bit lines LBL are positioned across the memory cell array MCA.

The row selector RS is a circuit for selecting one row of the memory cell array MCA located in the sub-core circuit SCC that includes this row selector RS, or one row of the corresponding memory cell array MCA. The row selector RS receives a row address, and based on the received row address, couples one of the local word lines LWL of the corresponding memory cell array MCA to one global word line GWL. The row selector RS includes multiple switches. Each switch is coupled to one global word line GWL at its one end, and is coupled to one local word line LWL at its another end. The switch is, for example, a metal oxide semiconductor field effect transistor (MOSFET).

The column selector CS is a circuit for selecting one column of the memory cell array MCA located in the sub-core circuit SCC that includes this column selector CS, or one column of the corresponding memory cell array MCA. The column selector CS receives a column address, and based on the received column address, couples one of the local bit lines LBL of the corresponding memory cell array MCA to one global bit line GBL. The column selector CS includes multiple switches. Each switch is coupled to one global bit line GBL at its one end, and is coupled to one local bit line LBL at its another end. The switch is, for example, a MOSFET.

Figure 4:
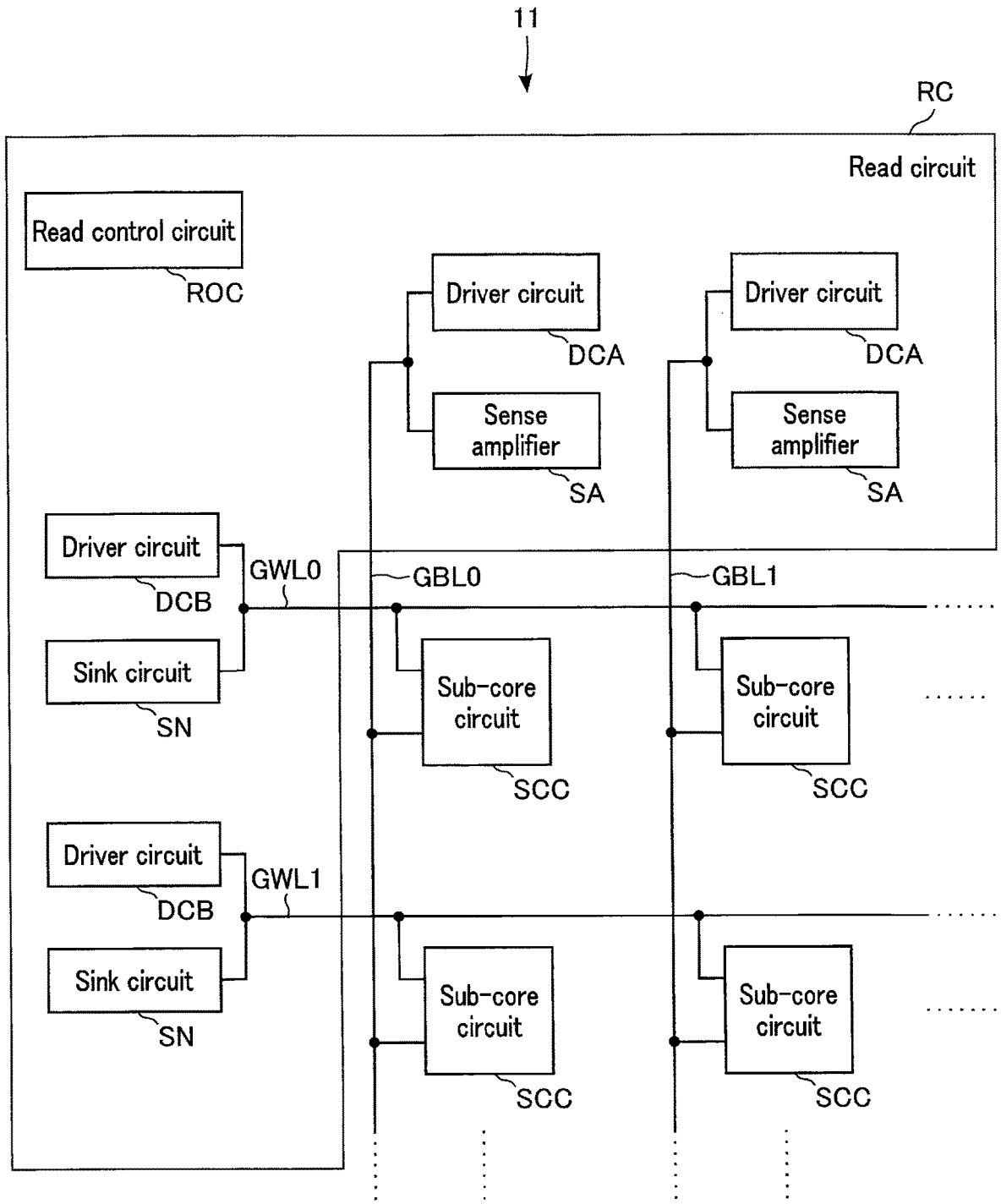
FIG. 4 shows detailed functional blocks of a part of the core circuit according to the first embodiment.

FIG. 4 shows detailed functional blocks of a part of the core circuit 11, in particular, functional blocks of the read circuit RC, according to the first embodiment. As shown in FIG. 4, the read circuit RC includes multiple pairs of a driver circuit DCA and a sense amplifier SA, multiple pairs of a driver circuit DCB and a sink circuit SN, and a read control circuit ROC.

Each pair of the driver circuit DCA and the sense amplifier SA is coupled to one global bit line GBL.

The driver circuit DCA is a circuit to apply a voltage for data reading to the global bit line GBL coupled to, or corresponding to, itself. The driver circuit DCA applies the voltage to the corresponding global bit line GBL under the control of the read control circuit ROC.

The sense amplifier SA, in the course of reading data under the control of the read control circuit ROC, temporarily retains a voltage which is based on the memory cell MC targeted for data reading, determines the data stored in the memory cell MC targeted for data reading based on the retained voltage, and outputs the determined data as the read data RD.

Each pair of the driver circuit DCB and the sink circuit SN is coupled to one global word line GWL.

The driver circuit DCB is a circuit to apply a voltage for data reading to the global word line GWL coupled to, or corresponding to, itself. The driver circuit DCB applies the voltage to the corresponding global word line GWL under the control of the read control circuit ROC.

The sink circuit SN is a circuit to selectively ground the global word line GWL coupled to or corresponding to itself, or to selectively couple this global word line GWL to a node having a ground voltage Vss (e.g., 0 V). The sink circuit SN grounds the corresponding global word line GWL under the control of the read control circuit ROC.

1.1.3. Circuit Configuration of Memory Cell Array

FIG. 5 is a circuit diagram of the memory cell array MCA according to the first embodiment. As shown in FIG. 5, M+1 local word lines LWL (LWL0, LWL1, . . . , and LWLM, where M is a natural number) and N+1 local bit lines LBL (LBL0, LBL1, . . . , and LBLN, where N is a natural number) are positioned across the memory cell array MCA.

Each memory cell MC includes a first node and a second node. Each memory cell MC is coupled to one local word line LWL at its first node, and to one local bit line LBL at its second node.

Each memory cell MC includes one MTJ element MTJ and one switching element SE. The MTJ element MTJ and the switching element SE in each memory cell MC are connected in series. The MTJ element MTJ is coupled to one local word line LWL, and the switching element SE is coupled to one local bit line LBL.

The MTJ element MTJ is an element showing a tunnel magnetoresistive effect and including a magnetic tunneling junction (MTJ). The MTJ element MTJ is adapted to switch between a low resistance state and a high resistance state. The MTJ element MTJ stores 1-bit data by utilizing a difference between the two resistance states. In one example, the MTJ element MTJ uses the low resistance state to store data "0" and the high resistance state to store data "1".

The switching element SE is an element for selecting the memory cell MC in which this switching element SE is included. The switching element SE includes two terminals.

The switching element SE turns to a high resistance state, for example, an electrically non-conductive state (an OFF state), while a voltage being applied between these two terminals is lower than a first threshold. When the voltage applied between the two terminals is increased to the first threshold or higher, the switching element SE turns to a low resistance state, for example, an electrically conductive state (an ON state). When the voltage applied between the two terminals of the switching element SE, which is in the low resistance state, is decreased to a second threshold or lower, the switching element SE turns to the high resistance state. The switching element SE has such a function of switching between the high resistance state and the low resistance state according to the size of the voltage applied in one (first) direction, and it also has a similar function with respect to another (second) direction opposite to the first direction. That is, the switching element SE is a bidirectional switching element. Turning on or off of the switching element SE enables the control of whether or not a current is supplied to the MTJ element MTJ coupled to this switching element SE, in other words, whether to select or non-select the MTJ element MTJ.

1.1.4. Structure of Memory Cell Array

Figure 6:
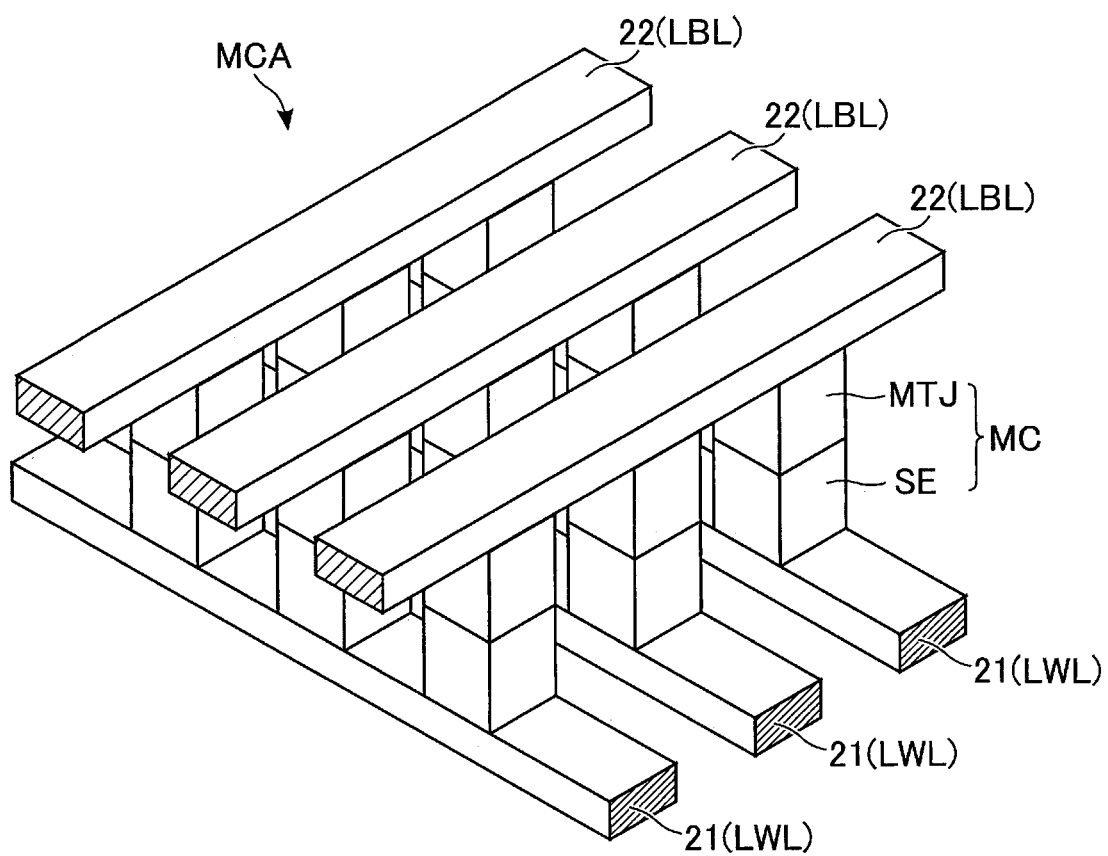
FIG. 6 is a perspective view of a part of the memory cell array according to the first embodiment.

FIG. 6 is a perspective view of a part of the memory cell array MCA according to the first embodiment. As shown in FIG. 6, there are multiple conductors 21 and 22.

The conductors 21 extend along the x axis and are arranged along the y axis. Each conductor 21 functions as one local word line LWL.

The conductors 22 are located above the conductors 21. The conductors 22 extend along the y axis and are arranged along the x axis. Each conductor 21 functions as one local bit line LBL.

One memory cell MC is provided at each of the intersections between the conductors 21 and 22. The memory cells MC are arranged in a matrix pattern over the x-y plane. Each memory cell MC includes a structure serving as the switching element SE and a structure serving as the MTJ element MTJ. The structure serving as the switching element SE and the structure serving as the MTJ element MTJ each include one or more layers. In one example, the structure serving as the MTJ element MTJ is located on the top face of the structure serving as the switching element SE. The memory cell MC at its bottom face contacts the top face of one conductor 21. The top face of the memory cell MC contacts the bottom face of one conductor 22. Note that the structure serving as the switching element SE may instead be located on the top face of the structure serving as the MTJ element MTJ.

1.1.5. Memory Cell

Figure 7:
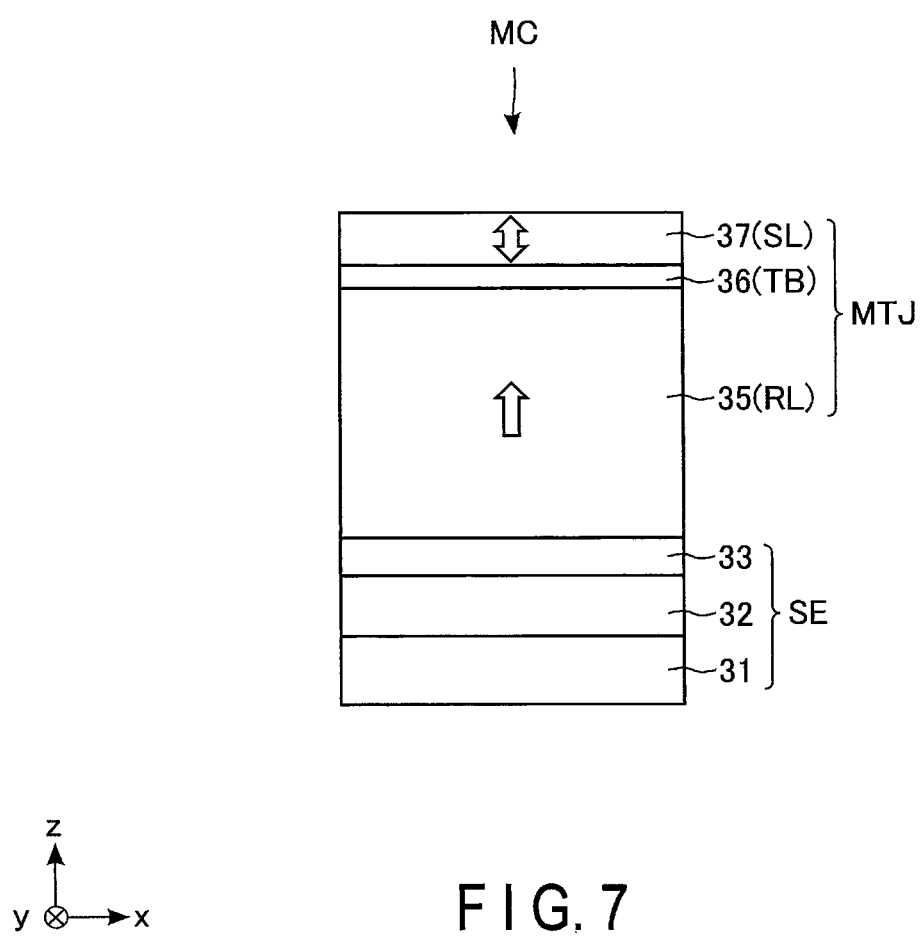
FIG. 7 shows a cross section of an exemplary structure of a memory cell according to the first embodiment.

FIG. 7 shows a cross section of an exemplary structure of the memory cell MC according to the first embodiment.

The switching element SE includes a variable resistance material (element) 32. The variable resistance material 32 is a material showing a dynamically variable resistance. The variable resistance material 32 is a switching element between two terminals, namely, a first terminal constituted by one of the top face and the bottom face of the variable resistance material 32 and a second terminal constituted by the other one of the top face and the bottom face of the variable resistance material 32. While a voltage being applied between the two terminals is lower than a first threshold, the variable resistance material 32 is in a high resistance state, for example, an electrically non-conductive state. When the voltage applied between the two terminals is increased to the first threshold or higher, the variable resistance material 32 turns to a low resistance state, for example, an electrically conductive state. When the voltage applied between the two terminals of the low resistance state variable resistance material 32 is decreased to a second threshold or lower, the variable resistance material 32 turns to the high resistance state. The variable resistance material 32 includes an insulator and a dopant introduced into the insulator by ion injection. The insulator includes, for example, an oxide, which may be $SiO_2$, or a material consisting substantially of $SiO_2$. Examples of the dopant include arsenic (As) and germanium (Ge). The description herein and the accompanying claims, when using a phrase "consisting (or formed) substantially of" or similar phrases with an expression "substantially" or the like, shall be taken to mean that an inclusion of unintended impurities in a component resulting from "consisting substantially of" is tolerated.

The switching element SE may further include a lower electrode 31 and an upper electrode 33. FIG. 7 shows such an example. The variable resistance material 32 is located on the top face of the lower electrode 31, and the upper electrode 33 is located on the top face of the variable resistance material 32.

The MTJ element MTJ includes a ferromagnetic layer 35, an insulating layer 36, and a ferromagnetic layer 37. In one example, as shown in FIG. 7, the insulating layer 36 is located on the top face of the ferromagnetic layer 35, and the ferromagnetic layer 37 is located on the top face of the insulating layer 36.

The ferromagnetic layer 35 is a layer of a material showing a ferromagnetic property. The ferromagnetic layer 35 has an easy magnetization axis along the direction penetrating through the interfaces of the ferromagnetic layer 35, the insulating layer 36, and the ferromagnetic layer 37. The easy magnetization axis forms, for example, an angle of 45° or greater and 90° or smaller with respect to each interface, and in one example, it extends along the direction orthogonal to the interfaces. The magnetization direction of the ferromagnetic layer 35 is intended to be unchanged by the data read and write of the memory cell MC. The ferromagnetic layer 35 is capable of functioning as a so-called reference layer. The ferromagnetic layer 35 may include multiple layers.

The insulating layer 36 is a layer of an insulator. For example, the insulating layer 36 includes magnesium oxide (MgO) or consists substantially of MgO, and functions as a so-called tunnel barrier.

The ferromagnetic layer 37 is a layer of a material showing a ferromagnetic property. For example, the ferromagnetic layer 37 includes cobalt iron boron (CoFeB) or boride iron (FeB), or consists substantially of CoFeB or FeB. The ferromagnetic layer 37 has an easy magnetization axis along the direction penetrating through the interfaces of the ferromagnetic layer 35, the insulating layer 36, and the ferromagnetic layer 37. The easy magnetization axis forms, for example, an angle of 45° or greater and 90° or smaller with respect to each interface, and in one example, it extends along the direction orthogonal to the interfaces. The magnetization direction of the ferromagnetic layer 37 is variable according to the writing of data in the memory cell MC, and the ferromagnetic layer 37 is capable of functioning as a so-called storage layer.

When the magnetization direction of the ferromagnetic layer 37 is parallel to the magnetization direction of the ferromagnetic layer 35, the MTJ element MTJ has a given low resistance. When the magnetization direction of the ferromagnetic layer 37 is anti-parallel to the magnetization direction of the ferromagnetic layer 35, the MTJ element MTJ has a resistance higher than the resistance when the magnetization direction of the ferromagnetic layer 37 and the magnetization direction of the ferromagnetic layer 43 are parallel to each other.

In response to a write current of a given size flowing from the ferromagnetic layer 37 to the ferromagnetic layer 35, the magnetization direction of the ferromagnetic layer 37 turns parallel to the magnetization direction of the ferromagnetic layer 35. In response to a write current of another given size flowing from the ferromagnetic layer 35 to the ferromagnetic layer 37, the magnetization direction of the ferromagnetic layer 37 turns anti-parallel to the magnetization direction of the ferromagnetic layer 35.

The MTJ element MTJ may include one or more additional layers.

Figure 8:
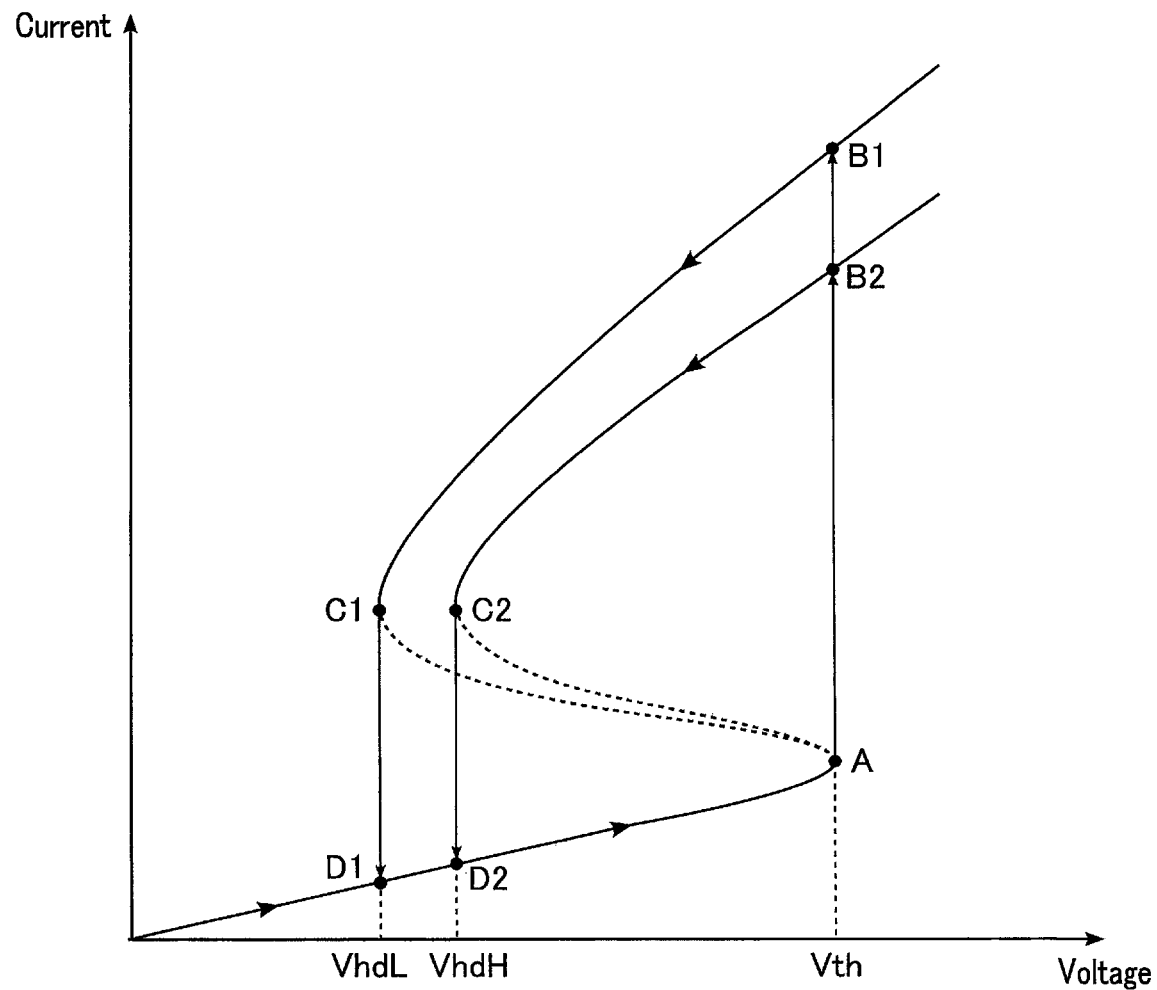
FIG. 8 is a graph showing exemplary curves of voltage-current characteristics of the memory cell according to the first embodiment.

FIG. 8 is a graph showing exemplary curves of the voltage-current characteristics of the memory cell MC according to the first embodiment. The horizontal axis of the graph indicates the size of a terminal voltage of the memory cell MC (a voltage between the first node and the second node of the memory cell MC). The vertical axis of the graph indicates, in a log scale, the size of a current flowing through the memory cell MC. In FIG. 8, dashed curves represent virtual characteristics which are difficult to observe in reality. FIG. 8 depicts the respective cases of the memory cell MC being in the low resistance state and the memory cell MC being in the high resistance state. The following description is applicable to both the cases of the memory cell MC being in the low resistance state and the memory cell MC being in the high resistance state.

Starting from zero voltage, as the voltage is increased, the current keeps increasing until the voltage reaches a threshold voltage Vth. The switching element SE of the memory cell MC remains in the OFF state, i.e., a non-conductive state, until the voltage reaches the threshold voltage Vth.

When the voltage is further increased and reaches the threshold voltage Vth, that is, when point A is reached, the voltage-current relationship changes discontinuously and shows the characteristics represented by either point B1 or B2. Each of the current at point B1 and the current at point B2 is much larger than the current at point A. Such an abrupt change in the current is based on an event that the switching element SE of the memory cell MC has been turned on. The sizes of the current at points B1 and B2 are attributable to the respective resistance states of the MTJ element MTJ of the memory cell MC.

Starting from the state where the switching element SE is ON, for example, where the voltage-current relationship shows the characteristics represented by the point B1 or B2, the current keeps decreasing as the voltage is decreased.

When the voltage is further decreased and reaches a given size, the voltage-current relationship changes discontinuously. The voltage at which the voltage-current relationship becomes discontinuous depends on the terminal voltage of the MTJ element MTJ of the memory cell MC, more specifically, whether the MTJ element MTJ is in the high resistance state or the low resistance state. With the MTJ element MTJ being in the low resistance state, the voltage-current relationship becomes discontinuous at point C1. With the MTJ element MTJ being in the high resistance state, the voltage-current relationship becomes discontinuous at point C2. The voltage-current relationship, upon reaching the point C1 or C2, shows the characteristics represented by corresponding one of points D1 and D2. The current at point D1 and the current at point D2 are much smaller than the current at point C1 and the current at point C2, respectively. Such an abrupt change in the current is based on an event that the switching element SE of the memory cell MC has been turned off.

The terminal voltage of the memory cell MC with the low resistance state MTJ element MTJ, which corresponds to the point C1, will be called a low holding voltage VhdL. The terminal voltage of the memory cell MC with the high resistance state MTJ element MTJ, which corresponds to the point C2, will be called a high holding voltage VhdH. Sizes of the respective high holding voltages VhdH of the multiple memory cells MC could differ from one another according to unintended variations in characteristics of the memory cells MC. Sizes of the respective low holding voltages VhdL of the multiple memory cells MC could differ from one another according to unintended variations in characteristics of the memory cells MC.

1.1.6. Voltage Generator

FIG. 9 shows the types of voltages output from the voltage generator 16 according to the first embodiment. As shown in FIG. 9, the voltage generator 16 generates a selected voltage Vsel, a non-select voltage Vusel, and a reference voltage Vch from a supply voltage fed to the memory device 1, and outputs the selected voltage Vsel, the unselected voltage Vusel, and the reference voltage Vch.

The selected voltage Vsel has a size which, when applied to one memory cell MC, turns on the switching element SE of this memory cell MC.

The unselected voltage Vusel has a size which does not turn on the switching element SE of one memory cell MC even when it is applied to this memory cell MC. Also, the unselected voltage Vusel has such a size that application of a voltage having a size equal to the difference between the selected voltage Vsel and the unselected voltage Vusel to one memory cell MC does not turn on the switching element SE of this memory cell MC. The unselected voltage Vusel is higher than the ground voltage Vss. The unselected voltage Vusel is lower than the selected voltage Vsel. In one example, the unselected voltage Vusel is half the selected voltage Vsel.

The reference voltage Vch is for use in determining whether or not a potential of a given size is larger than the ground voltage Vss. The reference voltage Vch is higher than the ground voltage Vss. In one example, the reference voltage Vch is set to be half the low holding voltage VhdL for the purpose of securing a margin.

1.1.7. Read Circuit

FIG. 10 shows the details of the read circuit RC according to the first embodiment. More specifically, FIG. 10 shows examples of the driver circuit DCA, the sense amplifier SA, the driver circuit DCB, and the sink circuit SN. It is shown in FIG. 10 that the driver circuit DCA, the sense amplifier SA, the driver circuit DCB, and the sink circuit SN are each coupled to one sub-core circuit SCC.

As shown in FIG. 10, the sink circuit SN includes a transistor Tr1. The transistor Tr1 is, for example, an n-type MOSFET. The transistor Tr1 is coupled between a node for the ground voltage Vss and a global word line GWL. The transistor Tr1 receives, at its gate electrode, a control signal S1. The control signal S1 is supplied from, for example, the read control circuit ROC.

The driver circuit DCB includes a transistor Tr2. The transistor Tr2 is, for example, an n-type MOSFET. The transistor Tr2 is coupled between a node of the voltage generator 16 that is for the unselected voltage Vusel, and the global word line GWL. The transistor Tr2 receives, at its gate electrode, a control signal S2. The control signal S2 is supplied from, for example, the read control circuit ROC.

The driver circuit DCA includes transistors Tr3 and Tr4. The transistor Tr3 is, for example, an n-type MOSFET. The transistor Tr3 is coupled between a node of the voltage generator 16 that is for the selected voltage Vsel, and a global bit line GBL. The transistor Tr3 receives, at its gate electrode, a control signal S3. The control signal S3 is supplied from, for example, the read control circuit ROC.

The transistor Tr4 is, for example, an n-type MOSFET. The transistor Tr4 is coupled between a node of the voltage generator 16 that is for the unselected voltage Vusel, and the global bit line GBL. The transistor Tr4 receives, at its gate electrode, a control signal S4. The control signal S4 is supplied from, for example, the read control circuit ROC.

The sense amplifier SA includes transistors Tr5, Tr6, and Tr7, a voltage adjustment circuit VMC, and an operational amplifier OP. The transistor Tr5 is coupled between the global bit line GBL and a node N1. The transistor Tr5 receives, at its gate electrode, a control signal S5. The control signal S5 is supplied from, for example, the read control circuit ROC.

The transistor Tr6 is coupled between the global bit line GBL and a node N2. The transistor Tr6 receives, at its gate electrode, a control signal S6. The control signal S6 is supplied from, for example, the read control circuit ROC.

The operational amplifier OP is coupled to a node N3 at its non-inverting input terminal. The operational amplifier OP is coupled to a node N4 at its inverting input terminal. The output of the operational amplifier OP serves as 1-bit read data RD.

The transistor Tr7 is coupled between a node of the voltage generator 16 that is for the reference voltage Vch, and the node N4. The transistor Tr7 receives, at its gate electrode, a control signal S7. The control signal S7 is supplied from, for example, the read control circuit ROC.

The voltage adjustment circuit VMC is a circuit to offset the received voltages and output an offset voltages. The voltage adjustment circuit VMC is coupled to the node N1 at its first input. The voltage adjustment circuit VMC is coupled to the node N2 at its second input. The voltage adjustment circuit VMC is coupled to the node N3 at its first output. The voltage adjustment circuit VMC is coupled to the node N4 at its second output.

The voltage adjustment circuit VMC has a configuration which allows the case of the nodes N1 and N2 having substantially the same voltage and the case of the nodes N1 and N2 having different voltages to be distinguished from each other using the operational amplifier OP. To this end, the voltage adjustment circuit VMC applies to the node N3 a voltage of the size corresponding to the voltage of the node N1 adjusted according to a predetermined method, and/or applies to the node N4 a voltage of the size corresponding to the voltage of the node N2 adjusted according to a predetermined method. The adjustment here may adopt any method, and one exemplary method will be given for the subsequent description to refer to.

The voltage adjustment circuit VMC, when the voltage of the node N1 and the voltage of the node N2 are substantially the same, outputs, at the node N3, the voltage of the node N1 or a voltage of a size equal to the size of an offset voltage of the node N1, and/or outputs, at the node N4, the voltage of the node N2 or a voltage of a size equal to the size of an offset voltage of the node N2. The phrase "substantially the same" shall be taken to mean that, while elements A and B are intended to be the same as each other, the case of the elements not being completely the same due to an inevitable error is tolerated.

For example, the voltage adjustment circuit VMC applies to the node N4 a voltage of the size corresponding to the voltage of the node N2 positively offset by ΔV, while applying to the node N3 a voltage of substantially the same size as the voltage of the node N1. Here, ΔV is smaller than the difference between the low holding voltage VhdL and the high holding voltage VhdH.

1.2. Operation

Figure 11:
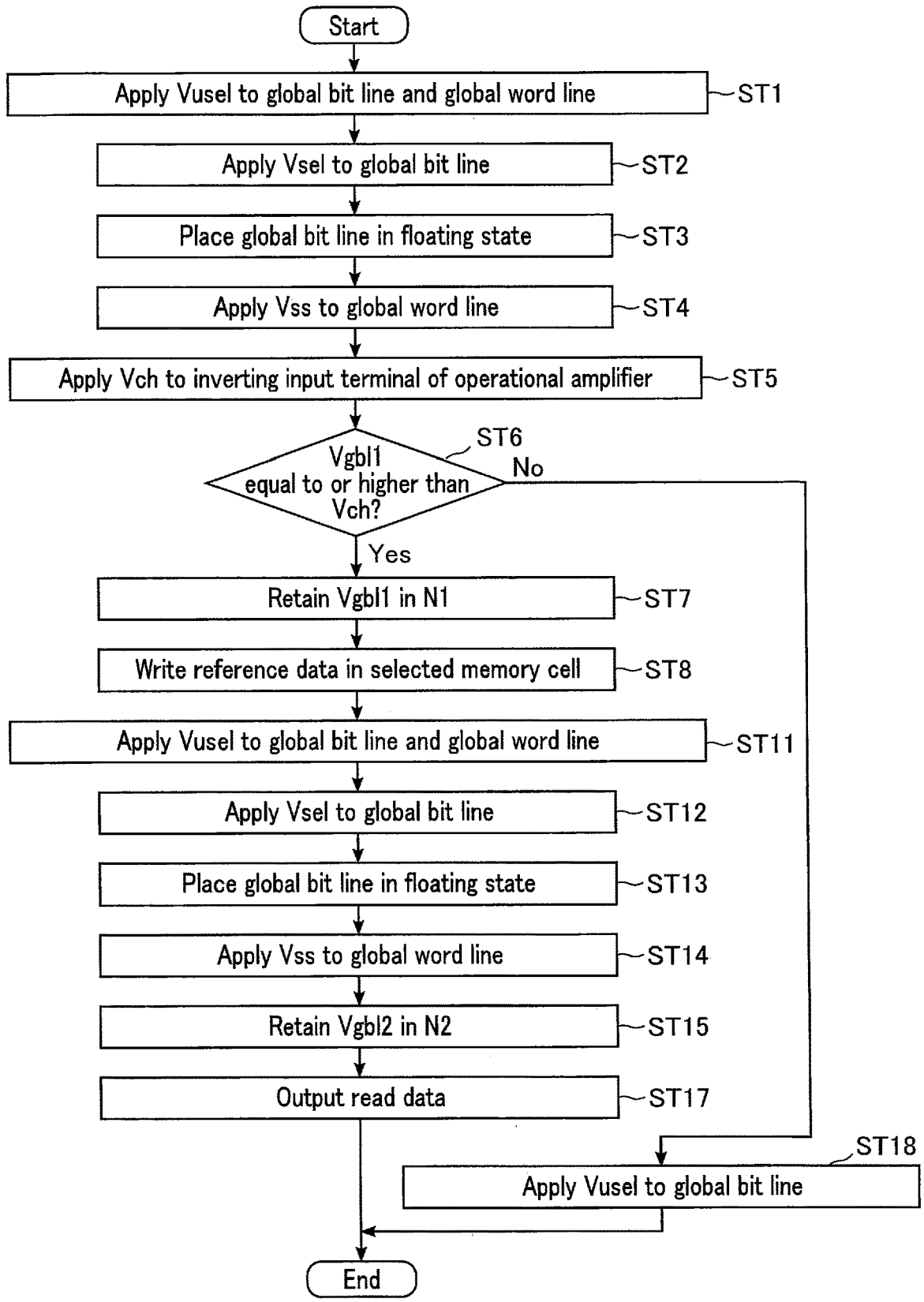
FIG. 11 shows a flow of a data read operation of the memory device according to the first embodiment.

FIG. 11 shows the flow of a data read operation of the memory device 1 according to the first embodiment. FIG. 11 concerns one sub-core circuit SCC. The flow of FIG. 11 is initiated upon the memory device 1 receiving an instruction for reading data from a given memory cell MC specified by the address signal ADD.

Operations each corresponding to the flow of FIG. 11 are concurrently performed for the multiple sub-core circuits SCC coupled to the multiple global bit lines GBL and one global bit line GWL. In other words, each step (ST) described below is performed for the multiple sub-core circuits SCC, or for the multiple global bit lines GBL coupled to the respective sub-core circuits SCC. The global word line GWL referred to in the description below is a single global word line GWL that is specified by the address ADD among the multiple global word lines GWL, and may be called a selected global word line GWLs. Also in the description below, the sub-core circuit SCC coupled to the selected global word line GWLs may be called a selected sub-core circuit SCCs. The description, when mentioning that a first voltage is applied to a given interconnect, will assume that the application of the first voltage to the interconnect is maintained until another voltage is applied.

At the start of the flow of FIG. 11, the selected global word line GWLs is in a state of being coupled to one local word line LWL of the selected sub-core circuit SCCs via the row selector RS of this selected sub-core circuit SCCs. The local word line LWL coupled to the selected global word line GWLs may be called a selected local word line LWLs.

At the start of the flow of FIG. 11, each global bit line GBL is in a state of being coupled to one local bit line LBL of the selected sub-core circuit SCCs via the column selector CS of this selected sub-core circuit SCCs. The local bit line LBL coupled to the global bit line GBL may be called a selected local bit line LBLs.

The memory cell MC coupled to the selected local word line LWLs and the selected local bit line LBLs may be called a selected memory cell MCs. The MTJ element MTJ in the selected memory cell MCs may be called a selected MTJ element MTJs.

The operation starts with a first sensing and checking. The first sensing and checking include steps ST1, ST2, ST3, ST4, ST5, ST6, and ST7.

The unselected voltage Vusel is applied to the global bit line GBL and the global word line GWL (ST1). Application of the unselected voltage Vusel to a given global bit line GBL can be realized by keeping the transistor Tr3 coupled to this global bit line GBL in an OFF state while keeping the transistor Tr4 coupled to this global bit line GBL in an ON state. Application of the unselected voltage Vusel to a given global word line GWL can be realized by keeping the transistor Tr1 coupled to this global word line GWL in an OFF state while keeping the transistor Tr2 coupled to this global word line GWL in an ON state.

The selected voltage Vsel is applied to the global bit line GBL (ST2). Application of the selected voltage Vsel to a given global bit line GBL can be realized by keeping the transistor Tr4 coupled to this global bit line GBL in an OFF state while keeping the transistor Tr3 coupled to this global bit line GBL in an ON state. With the application of the selected voltage Vsel to the global bit line GBL, the difference in size between the voltage of the global bit line GBL and the voltage of the selected global word line GWLs equals the selected voltage Vsel—the unselected voltage Vusel. As such, a voltage of the size equal to the selected voltage Vsel—the unselected voltage Vusel is applied to the selected memory cell MCs via the selected local word line LWLs and the selected local bit line LBLs. As described above with reference to FIG. 9, even when a voltage having a size equal to the difference between the selected voltage Vsel and the unselected voltage Vusel is applied to one memory cell MC, the switching element SE of this memory cell MC is not turned on. Accordingly, the switching element SE of the selected memory cell MCs in the selected sub-core circuit SCCs is not turned on.

The global bit line GBL is placed in an electrically floating state (ST3). That is, no voltage is applied to the global bit line GBL. Placing a given global bit line GBL in the floating state can be realized by keeping the transistors Tr3 and Tr4 coupled to this global bit line GBL in an OFF state so that the global bit line GBL is separated from the nodes that are applied with the respective voltages. As a result of the global bit line GBL becoming the floating state, charging of this global bit line GBL is terminated.

The ground voltage Vss is applied to the selected global word line GWLs (ST4). This can be realized by keeping the transistor Tr2 coupled to the selected global word line GWLs in an OFF state while keeping the transistor Tr1 coupled to the selected global word line GWLs in an ON state. With the application of the ground voltage Vss to the selected global word line GWLs, the difference in size between the potential of the global bit line GBL and the potential of the selected global word line GWLs equals the size of the selected voltage Vsel. As such, the selected voltage Vsel is applied to the selected memory cell MCs via the selected local word line LWLs and the selected local bit line LBLs. As described above with reference to FIG. 9, the selected voltage Vsel has a size which is larger than the threshold voltage Vth and which, when applied to the memory cell MC, turns on the switching element SE of this memory cell MC. Accordingly, the switching element SE of the selected memory cell MCs is turned on. As a result, a current flows from the global bit line GBL toward the selected global word line GWLs via the selected memory cell MCs. The voltage of the global bit line GBL, denoted as Vgbl1, thus decreases. The global bit line voltage Vgbl1 has one of the following three sizes.

As described with reference to FIG. 8, when the terminal voltage of the memory cell MC that includes the turned-on switching element SE and the high resistance state MTJ element MTJ is decreased and reaches the high holding voltage VhdH, the switching element SE is turned off and no current flows in the memory cell MC. As such, if the selected memory cell MCs includes the high resistance state MTJ element MTJ, the global bit line voltage Vgbl1 has a size corresponding to the time point at which the switching element SE of the selected memory cell MCs is turned off and the flow of current from the global bit line GBL is stopped, that is, the global bit line voltage Vgbl1 conforms to the high holding voltage VhdH. Likewise, if the selected memory cell MCs includes the low resistance state MTJ element MTJ, the global bit line voltage Vgbl1 has a size corresponding to the time point at which the switching element SE of the selected memory cell MCs is turned off and the flow of current from the global bit line GBL is stopped, that is, the global bit line voltage Vgbl1 in this case conforms to the low holding voltage VhdL.

There are instances where a switching element SE unintentionally remains in a conductive state at all times to cause short-circuiting at its two ends, and/or a local bit line LBL unintentionally causes short-circuiting with another local bit line LBL. Short-circuiting at the switching element SE and/or the local bit line LBL could occur during the production process of the memory device 1 and/or the use of the memory device 1. When the local bit line LBL involves short-circuiting, electrical charges of this local bit line LBL outflow to the local bit line LBL with which the short-circuiting has occurred. With the short-circuited switching element SE of the selected memory cell MCs and/or the short-circuited selected local bit line LBLs, the global bit line voltage Vgbl1 drastically decreases upon the global bit line GBL becoming the floating state. The drop of the global bit line voltage Vgbl1 does not stop at the high holding voltage Vhd or the low holding voltage Vhd, and the global bit line voltage Vgbl1 approaches the ground voltage Vss.

The reference voltage Vch is applied to the inverting input terminal of the operational amplifier OP (ST5). Application of the reference voltage Vch can be realized by turning on the transistor Tr7.

Whether or not the global bit line voltage Vgbl1 is equal to or higher than the reference voltage Vch is determined (ST6). The determination may be based on the output value of the operational amplifier OP. More specifically, the transistor Tr5 is turned on to couple the global bit line GBL to the non-inverting input terminal of the operational amplifier OP so that the global bit line voltage Vgbl1 is applied to the non-inverting input terminal of the operational amplifier OP. Subsequently, the operational amplifier OP is enabled by, for example, the read control circuit ROC. The operational amplifier OP accordingly outputs data of an H-level voltage if the global bit line voltage Vgbl1 is equal to or higher than the reference voltage Vch, and outputs data of an L-level voltage otherwise. Thus, if neither the switching element SE of the selected memory cell MCs nor the selected local bit line LBLs is short-circuited, the operational amplifier outputs the data of an H-level voltage. On the other hand, if there is short-circuiting at the switching element SE of the selected memory cell MCs and/or at the selected local bit line LBLs, the operational amplifier outputs the data of an L-level voltage. In the description below, the data output from the operational amplifier based on the comparison between the global bit line voltage Vgbl1 and the reference voltage Vch may be called check data.

The check data is received by the read control circuit ROC. If, for example, the check data is data "1" (i.e., has the H-level), the read control circuit ROC conducts subsequent processing for reading data from the selected memory cell MCs of the selected sub-core circuit SCCs. If, for example, the check data is data "0" (i.e., has the L-level), the read control circuit ROC does not conduct the subsequent processing for reading data from the selected memory cell MCs of the selected sub-core circuit SCCs. More concrete description will be given.

If the global bit line voltage Vgbl1 is equal to or higher than the reference voltage Vch (ST6_Yes), the global bit line voltage Vgbl1 is retained by the node N1 (ST7). This can be realized by turning on and then turning off the transistor Tr5. Coupling the global bit line GBL to the node N1 allows the node N1 to have the global bit line voltage Vgbl1. The subsequent turning off of the transistor Tr5 places the node N1 in the floating state, so that the global bit line voltage Vgbl1 is saved by the node N1. As a result, the global bit line voltage Vgbl1 (i.e., substantially the same voltage as the global bit line voltage Vgbl1) is applied to the node N3.

Reference data is written in the selected memory cell MCs (ST8). The reference data to be written may be either data "0" or data "1", as long as it is determined in advance. By way of example, it will be assumed that data "0" is written, that is, the selected MTJ element MTJs is set to the low resistance state. The description will be consistent with this example.

After step ST8, a second sensing is performed by steps ST11, ST12, ST13, ST14, and ST15. Here, the steps ST11, ST12, ST13, and ST14 are equal to the steps ST1, ST2, ST3, and ST4, respectively. Upon performing the steps ST11, ST12, ST13, and ST14, a global bit line voltage Vgbl2 has the low holding voltage Vhdl according to the same principles as those described for the steps ST1, ST2, ST3, and ST4.

The global bit line voltage Vgbl2 is retained by the node N2 (ST15). This can be realized by turning on and then turning off the transistor Tr6. Coupling the global bit line GBL to the node N2 allows the node N2 to have the global bit line voltage Vgbl2. The subsequent turning off of the transistor Tr6 places the node N2 in the floating state, so that the global bit line voltage Vgbl2 is saved by the node N2. As a result, a voltage of the size corresponding to the offset global bit line voltage Vgbl2 is applied to the node N4.

The operational amplifier OP outputs the data determined to be stored in the selected memory cell MCs (ST17). This can be realized by the read control circuit ROC enabling the operational amplifier OP. Since the selected MTJ element MTJs has been set to the low resistance state as step ST8, the node N4 has a voltage of the size conforming to the low holding voltage VhdL+ΔV. Meanwhile, the node N1 has the low holding voltage VhdL or the high holding voltage VhdH based on the resistance state of the selected MTJ element MTJs at the start of the flow of FIG. 11. Accordingly, the node N3 has the low holding voltage VhdL or the high holding voltage VhdH. As such, if the selected MTJ element MTJs is in the low resistance state at the start of the flow, the operational amplifier OP outputs an L-level voltage. Based on this, when the output of the operational amplifier OP is at the L level, it is determined that the selected MTJ element MTJs has been in the low resistance state, in other words, that the selected memory cell MCs has stored data "0". On the other hand, if the selected MTJ element MTJs is in the high resistance state at the start of the flow, the operational amplifier OP outputs an H-level voltage. Based on this, when the output of the operational amplifier OP is at the H level, it is determined that the selected MTJ element MTJs has been in the high resistance state, in other words, that the selected memory cell MCs has stored data "1".

After step ST17, the data determined to be stored in the selected memory cell MCs is written in the selected memory cell MCs, and the flow comes to the end.

If the global bit line voltage Vgbl1 is not equal to or higher than the reference voltage Vch (ST6_No), the ground voltage Vss is applied to the selected global word line GWLs (ST18). The flow is then ended. As discussed for step ST6, if the global bit line voltage Vgbl1 is lower than the reference voltage Vch, there is a possibility of short-circuiting at the switching element SE of the selected memory cell MCs, and/or short-circuiting at the selected local bit line LBLs. In this case, accurate data reading from the selected memory cell MCs would be hampered. Accordingly, the processing of step ST7 and the subsequent steps for reading data from this selected memory cell MCs is not performed. For this purpose, the global bit line GBL receives, for example, the unselected voltage Vusel. Since the processing is omitted from step ST7 and onward, the operational amplifier OP outputs data that is not based on the resistance state of the selected MTJ element MTJs. As such, the read data RD might contain a wrong value. This can be addressed by, for example, the memory controller performing error correction.

Figure 13:
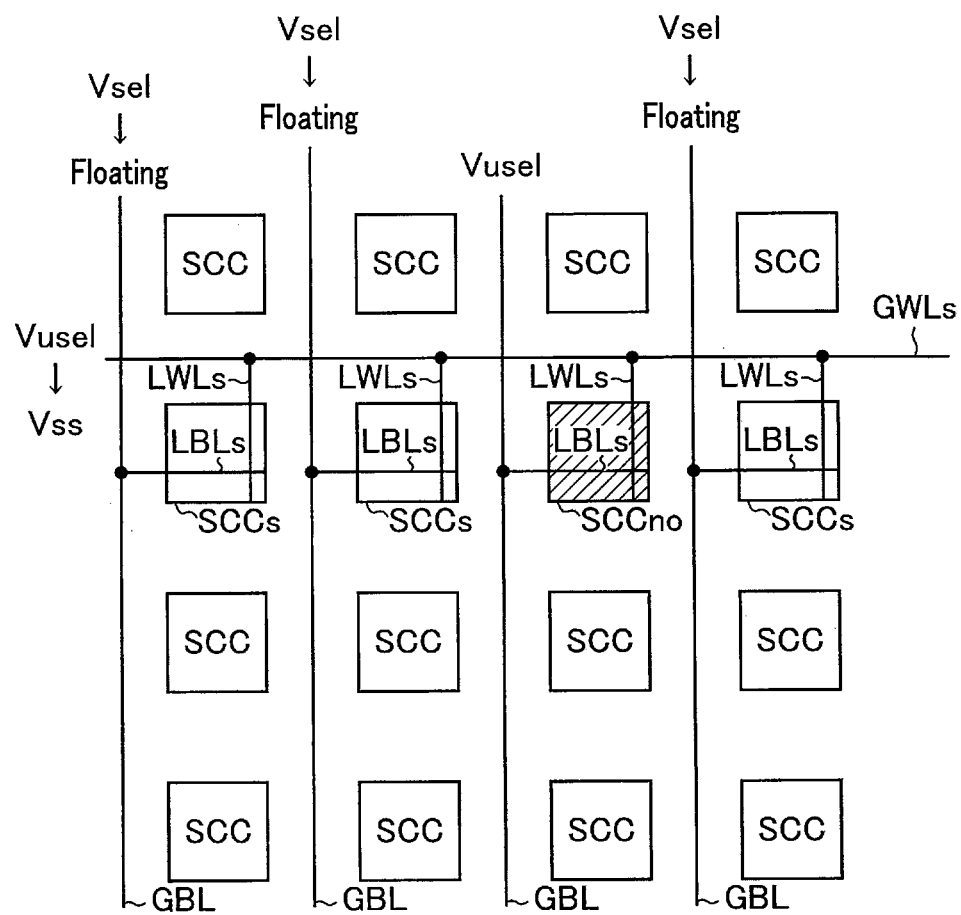
FIG. 13 conceptually shows a partial layout of the memory device according to the first embodiment, as well as its state transition during the operation.

FIGS. 12 and 13 conceptually show a partial layout of the memory device 1 according to the first embodiment, as well as its state transition during the operation. FIGS. 12 and 13 assume an example where the sub-core circuits SCC are arranged in a matrix of 4 rows×4 columns on the substrate of the memory device 1. In FIGS. 12 and 13, the sub-core circuits SCC on the second row from the top are the selected sub-core circuits SCCs.

FIG. 12(a) shows the state corresponding to the steps ST2 and ST3 in the flow of FIG. 11. As shown in FIG. 12(a), each global bit line GBL is left in the floating state after application of the selected voltage Vsel. In each selected sub-core circuit SCCs, the corresponding global bit line GBL is coupled to the selected local bit line LBLs of one same address.

FIG. 12(b) shows the state corresponding to the step ST4 in the flow of FIG. 11. The selected global word line GWLs is being applied the ground voltage Vss. In each selected sub-core circuit SCCs, the selected global word line GWLs is coupled to the selected local word line LWLs of one same address. Note that, in FIGS. 12 and 13, the selected local bit line LBLs and the selected local word line LWLs are indicated in only the selected sub-core circuits SCCs. The sub-core circuits SCC other than the selected sub-core circuits SCCs may be called non-selected sub-core circuits SCCus.

Placing the global bit line GBL in the floating state concurrently with applying the ground voltage Vss to the selected global word line GWLs causes each global bit line GBL to have either the low holding voltage VhdL or the high holding voltage VhdH based on the data stored in the corresponding selected memory cell MCs coupled to it. Supposing that the switching element SE of the selected MTJ element MTJs and/or the selected local bit line LBLs are short-circuited in one selected sub-core circuit SCCs, the voltage of the global bit line GBL coupled to this selected sub-core circuit SCCs turns to the ground voltage Vss. In the description below, such a selected sub-core circuit SCCs may be called a non-operating sub-core circuit SCCno. FIGS. 12 and 13 show the non-operating sub-core circuit SCCno with hatching.

FIG. 13 shows the state corresponding to the step ST7 and the subsequent steps, in particular, to the steps ST12, ST13, and ST14 in the flow of FIG. 11. Each selected sub-core circuit SCCs is subjected to the subsequent operation while the non-operating sub-core circuit SCCno is not subjected to the subsequent operation. That is, the potential of the global bit line GBL coupled to the selected sub-core circuit SCCs is saved by the node N1, the reference data is written in the selected memory cell MCs of the selected sub-core circuit SCCs, the global bit line GBL coupled to the selected sub-core circuit SCCs is applied with the selected voltage Vsel and thereafter placed in the floating state, and the selected global word line GWLs is applied with the unselected voltage Vusel and then the ground voltage Vss. During this process, the global bit line GBL coupled to the non-operating sub-core circuit SCCno is kept at the unselected voltage Vusel.

1.3. Advantages (Advantageous Effects)

According to the first embodiment, the selected memory cell MCs is applied with a voltage equal to or higher than the threshold voltage Vth while the global bit line GBL is in the floating state after it charges, and then, if the voltage of the global word line GWL falls below the reference voltage Vch, this global bit line GBL is kept at the unselected voltage Vusel during the subsequent operation for reading data from the selected memory cell MCs. The global bit line voltage Vgbl1 being lower than the reference voltage Vch is indicative of the occurrence of short-circuiting at the switching element SE of the selected memory cell MCs and/or short-circuiting at the selected local bit line LBLs. Based on this, the global bit line GBL having a voltage lower than the reference voltage Vch (or the detected global bit line GBL) receives the unselected voltage Vusel.

With the configuration of having the detected global bit line GBL receive the selected voltage Vusel, a current having an unintended size can be prevented from flowing in the selected memory cell MCs which would occur due to application of the selected voltage Vsel to the detected global bit line GBL while short-circuiting is involved in the switching element SE of the selected memory cell MCs. Accordingly, malfunctioning of the components of the memory device 1 due to an overcurrent can be suppressed.

With the configuration of having the detected global bit line GBL receive the unselected voltage Vusel, the need to excessively increase the tolerable load of the voltage generator 16 can be avoided. This will be explained in more detail. The voltage generator 16 may use a sole power supply circuit for applying one identical voltage to multiple independent interconnects. According to the example shown in FIG. 12, the power supply circuit which outputs the selected voltage Vsel during the state shown in FIG. 12(a) is coupled to all of the four global bit lines GBL so as to apply the selected voltage Vsel to each of the four global bit lines GBL. During this application of the selected voltage Vsel, the output node of the power supply circuit for the selected voltage Vsel is electrically coupled to the selected global word line GWLs via the non-operating sub-core circuit SCCno shown in FIG. 12(b). Thus, the potential of the output node of the power supply circuit for the selected voltage Vsel drops toward the unselected voltage Vusel. This makes it difficult for the power supply circuit which outputs the selected voltage Vsel to maintain the potential of its node for outputting the selected voltage Vsel, and consequently, each of the potentials of the four global bit lines GBL, at the selected voltage Vsel. That is, the non-operating sub-core circuit SCCno here functions as an unintended load on the power supply circuit. One conceivable measure against this is to adapt the power supply circuit to constantly have an enhanced tolerable load; however, manufacturing such a power supply circuit is impractical. Furthermore, unless the global bit lines GBL are kept at the selected voltage Vsel, data reading with the selected sub-core circuits SCCs, which include the switching element SE and the selected local bit line LBLs free from short-circuiting, is hampered. With the configuration of turning the detected global bit line GBL to the unselected voltage Vusel, the need to excessively increase the tolerable load of the power supply circuit can be avoided, and also accurate data reading from the normally working selected sub-core circuits SCCs can be secured.

2. Second Embodiment

The second embodiment differs from the first embodiment in the voltage application for acquiring the check data.

2.1. Configuration

FIG. 14 shows the types of voltages output from a voltage generator 16b according to the second embodiment. As shown in FIG. 14, the voltage generator 16b generates the selected voltage Vsel, the unselected voltage Vusel, the reference voltage Vch, and additionally a check voltage Vis from a supply voltage fed to a memory device 1b according to the second embodiment, and outputs the selected voltage Vsel, the unselected voltage Vusel, the reference voltage Vch, and the check voltage Vis. The check voltage Vis is higher than the threshold voltage Vth of the switching element SE. The check voltage Vis has such a size that application of a voltage having a size equal to the difference between the check voltage Vis and the unselected voltage Vusel to one memory cell MC does not turn on the switching element SE of this memory cell MC.

FIG. 15 shows the details of a read circuit RCb according to the second embodiment. As shown in FIG. 15, the read circuit RCb includes a driver circuit DCAb. The driver circuit DCAb further includes a transistor Tr11. The transistor Tr11 is, for example, an n-type MOSFET. The transistor Tr11 is coupled between a node of the voltage generator 16b that is for the check voltage Vis, and the global bit line GBL. The transistor Tr11 receives, at its gate electrode, a control signal S11. The control signal S11 is supplied from, for example, the read control circuit ROC.

2.2. Operation

Figure 16:
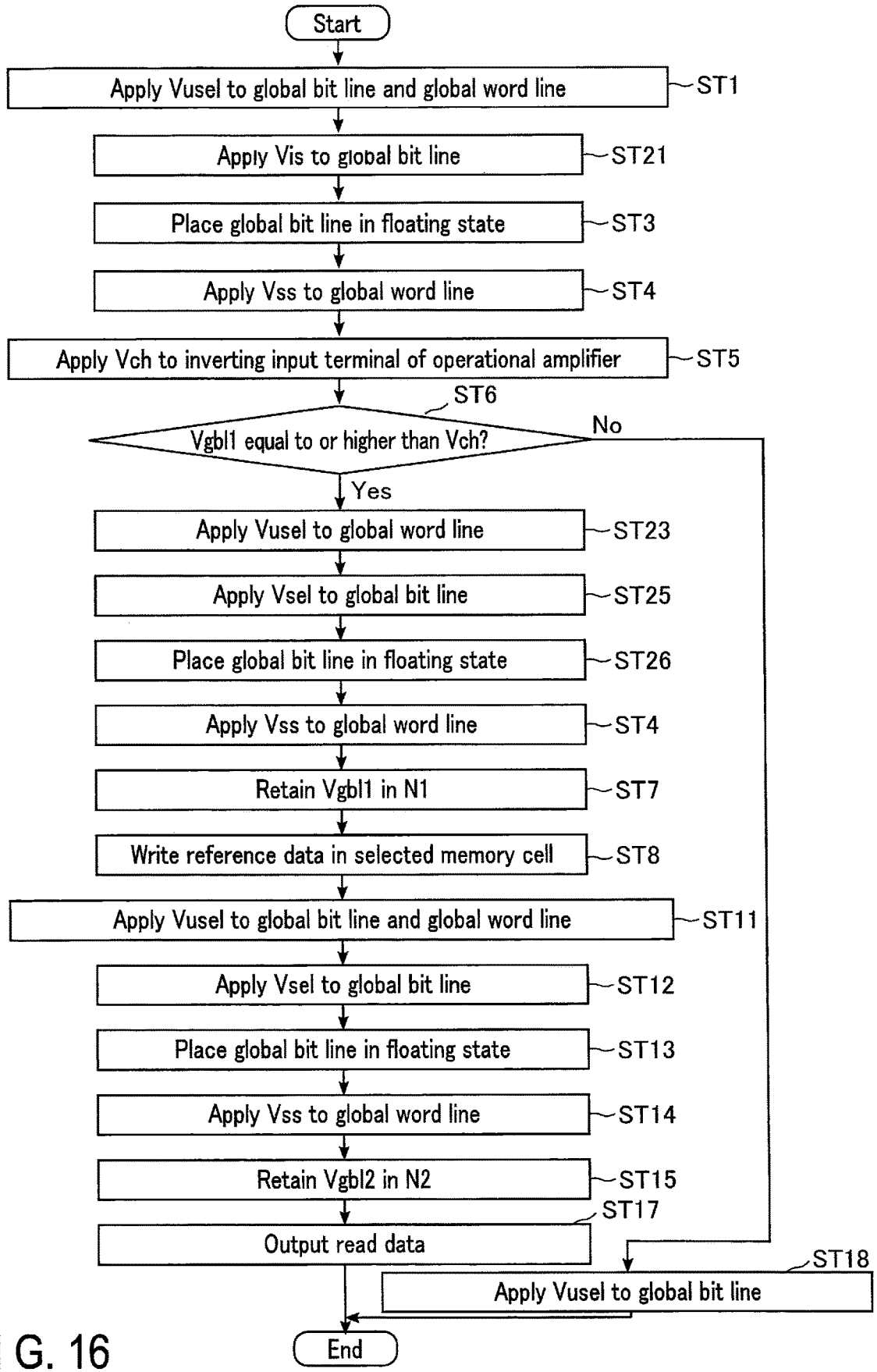
FIG. 16 shows a flow of a data read operation with a memory device according to the second embodiment.

FIG. 16 shows the flow of a data read operation of the memory device 1b according to the second embodiment. Similar to FIG. 11 for the first embodiment, FIG. 16 concerns one sub-core circuit SCC. The description will concentrate on what differs from FIG. 11. The flow of FIG. 16 is initiated upon the memory device 1b receiving an instruction for reading data from a given memory cell MC specified by the address signal ADD.

The operation starts with checking. The checking includes ST1, ST21, ST3, ST4, ST5, and ST6. For the application of the unselected voltage Vusel as step ST1, the transistor Tr11 is also kept in an OFF state.

After step ST1, the check voltage Vis is applied to the global bit line GBL (ST21). This can be realized by keeping the transistors Tr3 and Tr4 coupled to the global bit line GBL in an OFF state while keeping the transistor Tr11 coupled to this global bit line GBL in an ON state. Since the check voltage Vis is higher than the unselected voltage Vusel, a potential difference is formed between the global bit line GBL and the global word line GWL. Here, as described above with reference to FIG. 14, the check voltage Vis has such a size that application of a voltage having a size equal to the difference between the check voltage Vis and the unselected voltage Vusel to one memory cell MC does not turn on the switching element SE of this memory cell MC. As such, the switching element SE of the selected memory cell MCs in the selected sub-core circuit SCCs is not turned on.

As step ST3, for placing the global bit line GBL in the floating state, the transistor Tr11 is also kept in the OFF state. As a result of the global bit line GBL becoming the floating state, charging of this global bit line GBL is terminated.

By performing step ST4, the switching element SE of the selected memory cell MCs is turned on. Then, if neither the switching element SE nor the selected local bit line LBLs is short-circuited, the global bit line voltage Vgbl1 drops to the low holding voltage VhdL or the high holding voltage VhdH. On the other hand, if there is short-circuiting at the switching element SE of the selected memory cell MCs and/or at the selected local bit line LBLs, the global bit line voltage Vgbl1 approaches the ground voltage Vss.

Steps ST5 and ST6 are performed. The check data is acquired by step ST5. With the check data, the case of the switching element SE of the selected memory cell MCs and/or the selected local bit line LBLs experiencing short-circuiting and the case of the switching element SE of the selected memory cell MCs and the selected local bit line LBLs both being free from short-circuiting can be distinguished from each other.

If the global bit line voltage Vgbl1 is equal to or higher than the reference voltage Vch (ST6_Yes), the first sensing, the reference data writing, and the second sensing are performed for the selected memory cell MCs. In other words, steps ST23, ST25, ST26, ST4, and ST7 are performed for the first sensing. By step ST23, the unselected voltage Vusel is applied to the global word line GWL. Step ST25 is similar to step ST2 in the flow of FIG. 11 according to the first embodiment. Step ST26 is similar to step ST3 in the flow of FIG. 11 according to the first embodiment. By step ST8, the reference data is written in the selected memory cell MCs. Steps ST11, ST12, ST13, ST14, and ST15 are performed for the second sensing. Step ST17 is then performed.

If the global bit line voltage Vgbl1 is not equal to or higher than the reference voltage Vch (ST6_No), none of the first sensing, the reference data writing, and the second sensing are performed for the selected memory cell MCs. The global bit line GBL receives the unselected voltage Vusel (ST18), and the flow is ended.

2.3. Advantages

According to the second embodiment, as in the first embodiment, the selected memory cell MCs is applied with a voltage equal to or higher than the threshold voltage Vth while the global bit line GBL is in the floating state after it charges, and then, if the voltage of the global word line GWL falls below the reference voltage Vch, this global bit line GBL is kept at the unselected voltage Vusel during the subsequent operation for reading data from the selected memory cell MCs. Therefore, the same advantages as those of the first embodiment can be obtained.

3. Third Embodiment

The third embodiment differs from the first and second embodiments in the data reading scheme.

FIG. 17 shows the details of a read circuit RCc according to the third embodiment. As shown in FIG. 17, the read circuit RCc includes a sense amplifier SAc. The sense amplifier SAc includes an operational amplifier OPc. The operational amplifier OPc is coupled to a global bit line GBL at its non-inverting input terminal.

The read circuit RCc further includes a transistor Tr21. The transistor Tr21 is, for example, an n-type MOSFET. The transistor Tr21 is coupled between a node of the voltage generator 16 that is for a referential voltage Vref, and the node N4. The transistor Tr21 receives, at its gate electrode, a control signal S21. The control signal S21 is supplied from, for example, a read control circuit ROCc. The referential voltage Vref has a size equal to the average of the low holding voltage VhdL and the high holding voltage VhdH. In one example, the referential voltage Vref has a size equal to the average of a value obtained by averaging the low holding voltages VhdL of all the memory cells MC in a memory device 1c according to the third embodiment and a value obtained by averaging the high holding voltages VhdH of all the memory cells MC in the memory device 1c.

Figure 18:
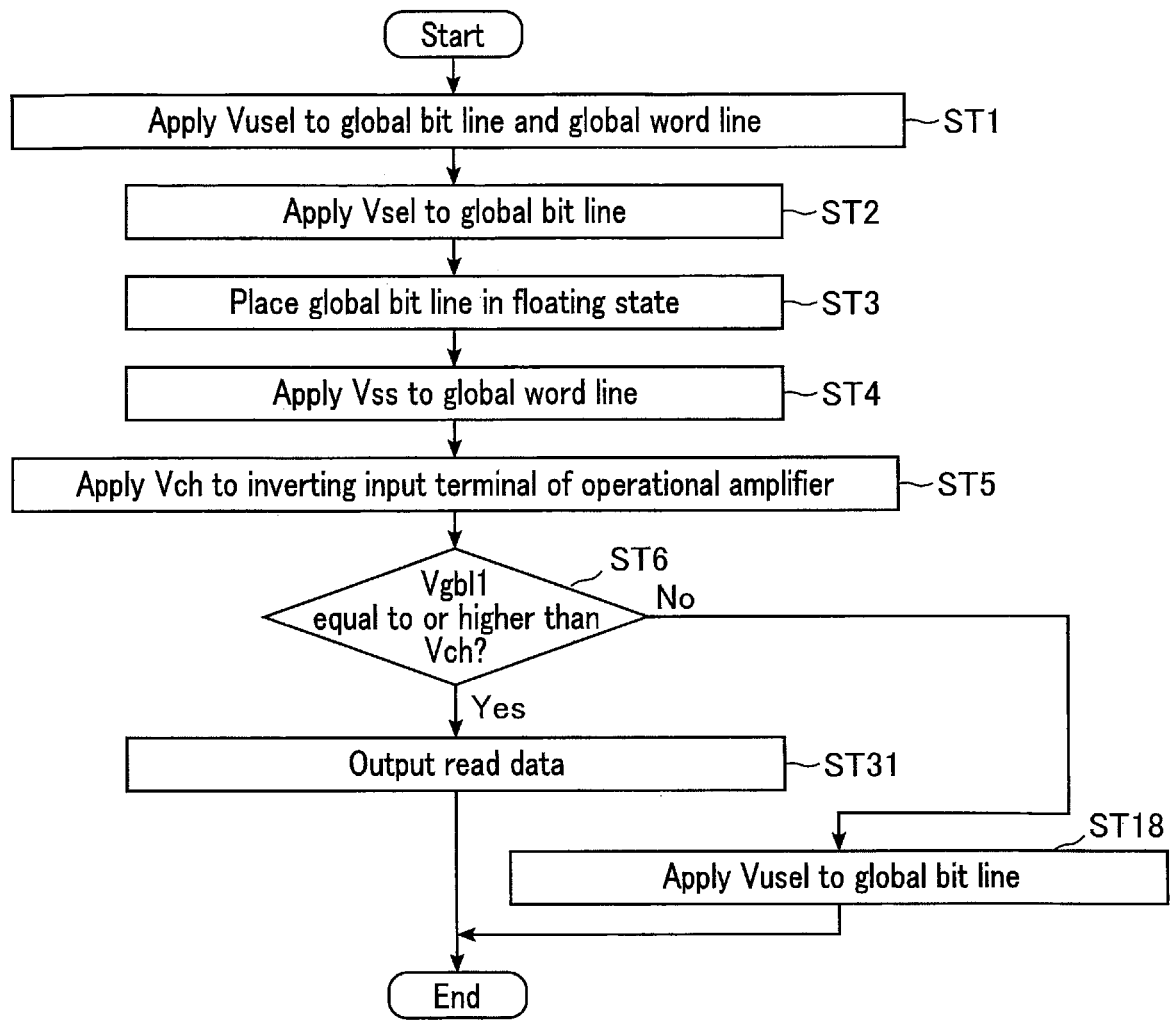
FIG. 18 shows a flow of a data read operation with a memory device according to the third embodiment.

FIG. 18 shows the flow of a data read operation of the memory device 1c according to the third embodiment. FIG. 18 concerns one sub-core circuit SCC, as in FIG. 11 for the first embodiment. The flow of FIG. 18 is initiated upon the memory device 1c receiving an instruction for reading data from a given memory cell MC specified by the address signal ADD.

As shown in FIG. 18, the operation starts with checking. In other words, steps ST1, ST2, ST3, ST4, ST5, and ST6 are performed.

If the global bit line voltage Vgbl1 is equal to or higher than the reference voltage Vch (ST6_Yes), the operational amplifier OPc outputs data determined to be stored in the selected memory cell MCs (ST31). This can be realized by enabling the operational amplifier OPc while keeping the transistor Tr7 in an OFF state and the transistor Tr21 in an ON state. The data determined to be stored in the selected memory cell MCs is based on the size of the global bit line voltage Vgbl1. That is, the global bit line voltage Vgbl1 used for determining whether or not the selected local bit line LBLs and the selected memory cell MCs (in particular, its switching element SE) are normally working is also used for determining the data stored in the selected memory cell MCs. If the global bit line voltage Vgbl1 is higher than the referential voltage Vref, the operational amplifier OPc outputs the read data RD of an H-level voltage. If the global bit line voltage Vgbl1 is lower than the referential voltage Vref, the operational amplifier OPc outputs the read data RD of an L-level voltage.

If the global bit line voltage Vgbl1 is not equal to or higher than the reference voltage Vch (ST6_No), data is not read from the selected memory cell MCs, that is, step ST31 is not performed. The global bit line GBL receives the unselected voltage Vusel (ST18), and the flow is ended.

The foregoing description and the flow of FIG. 18 assume an example where the third embodiment is based on the first embodiment. The third embodiment may be based on the second embodiment as well. In this case, step ST2 is replaced with step ST21.

According to the third embodiment, as in the first embodiment, the selected memory cell MCs is applied with a voltage equal to or higher than the threshold voltage Vth while the global bit line GBL is in the floating state after it charges, and then, if the voltage of the global word line GWL falls below the reference voltage Vch, this global bit line GBL is kept at the unselected voltage Vusel during the subsequent operation for reading data from the selected memory cell MCs. Therefore, according to the third embodiment where the case of data reading based on the comparison with the referential voltage Vref is assumed, the same advantages as those of the first embodiment can also be obtained.

4. Fourth Embodiment

The fourth embodiment relates to data reading performed as a part of data writing. The fourth embodiment can be combined with any of the first to third embodiments. By way of example, the description will assume an instance where the fourth embodiment is based on the third embodiment.

A memory device 1d according to the fourth embodiment has a configuration conforming to the configuration of the memory device 1 according to the embodiment on which the fourth embodiment is based. Note, however, that the fourth embodiment employs a write circuit WCd configured to be capable of conducting the following operations.

FIG. 19 shows the flow of a data read operation of the memory device 1d according to the fourth embodiment. FIG. 19 concerns one sub-core circuit SCC, as in FIG. 11 for the first embodiment. The flow of FIG. 19 is initiated upon the memory device 1d receiving a write instruction and write data for writing in a given memory cell MC specified by the address signal ADD.

As shown in FIG. 19, the operation starts with checking. The checking is similar to the checking in the third embodiment. In other words, steps ST1, ST2, ST3, ST4, ST5, and ST6 are performed.

If the global bit line voltage Vgbl1 is equal to or higher than the reference voltage Vch (ST6_Yes), the subsequent operation for data writing is performed. More specifically, step ST31 is performed so that the read data RD is output.

Whether or not the read data RD differs from the write data WD for the selected memory cell MCs is determined (ST41). The determination can be performed with the write circuit WCd. The write circuit WCd includes a comparator circuit. The comparator circuit receives the read data RD and the write data WD. The comparator circuit outputs comparison result data indicative of whether the read data RD and the write data WD are different from, or the same as, each other. In one example, the comparison result data is data "1" when the read data RD and the write data WD are the same as each other, and it is data "0" when the read data RD and the write data WD are different from each other.

If the read data RD and the write data WD are different from each other (ST41_Yes), the write circuit WCd writes the write data WD in the selected memory cell MCs (ST42). Upon completing step ST42, the flow is ended.

If the global bit line voltage Vgbl1 is not equal to or higher than the reference voltage Vch (ST6_No), the subsequent operation for data writing is not performed, that is, none of steps ST31, ST42, and ST42 are performed. The global bit line GBL receives the unselected voltage Vusel, and the flow is ended.

If the read data RD and the write data WD are the same as each other (ST41_No), the write data WD does not need to be written. As such, the subsequent operation for data writing is not performed, that is, step ST42 is not performed. The global bit line GBL receives the unselected voltage Vusel, and the flow is ended.

According to the fourth embodiment, as in the first to third embodiments, the selected memory cell MCs is applied with a voltage equal to or higher than the threshold voltage Vth while the global bit line GBL is in the floating state after it charges, and then, if the voltage of the global word line GWL falls below the reference voltage Vch, this global bit line GBL is kept at the unselected voltage Vusel during the subsequent operation for writing data in the selected memory cell MCs. Therefore, also in the instances of data writing based on the data read from the selected memory cell MCs, the same advantages as those of the combined embodiment, i.e., any of the first to third embodiments, can also be obtained.

4. Modification

The memory cell MC may discretionarily include any variable resistance element in lieu of the MTJ element MTJ. The variable resistance element is, similar to the MTJ element MTJ, an element capable of dynamically switching between two resistance states. The variable resistance element switches between the two resistance states according to the current flowing through the variable resistance element and/or the voltage applied to the variable resistance element.

While certain embodiments have been described, they have been presented by way of example only, and are not intended to limit the scope of the inventions. Indeed, the novel embodiments described herein may be embodied in a variety of other forms. Furthermore, various omissions, substitutions, and changes in the form of the embodiments may be made without departing from the spirit of the inventions. The accompanying claims and their equivalents are intended to cover such forms or modifications as would fall within the scope and spirit of the inventions.

What is claimed is:

1. A memory device comprising:
  a first interconnect;
  a second interconnect;
  a first memory cell between the first interconnect and the second interconnect, the first memory cell comprising a first variable resistance element and a first switching element, and the first switching element being configured to transition from an ON state to an OFF state in response to a voltage applied between two terminals of the first switching element being decreased; and
  a read circuit configured to:
    place the second interconnect in a floating state, and
    after placing the second interconnect in the floating state, and based on a comparison between a first voltage of the second interconnect at a time point of the first switching element becoming the OFF state and a second voltage, either:
      apply a third voltage to the second interconnect and then place the second interconnect in the floating state, or
      apply a fourth voltage lower than the third voltage to the second interconnect without applying the third voltage to the second interconnect.

2. The memory device according to claim 1, wherein the read circuit is further configured to:
  apply a fifth voltage to the second interconnect,
  place the second interconnect in the floating state after applying the fifth voltage to the second interconnect, and
  apply a sixth voltage lower than the fifth voltage to the first interconnect while the second interconnect is in the floating state, and
  wherein the first voltage is a voltage of the second interconnect during application of the sixth voltage to the first interconnect while the second interconnect is in the floating state.

3. The memory device according to claim 2, wherein the fifth voltage has a size to turn on the first switching element.

4. The memory device according to claim 2, wherein the fifth voltage substantially equals the third voltage in size.

5. The memory device according to claim 1, wherein the read circuit is further configured to, in a case where the first voltage is higher than the second voltage:
  write data in the first memory cell, and
  output data based on a comparison between the first voltage and a seventh voltage, the seventh voltage being a voltage of the second interconnect during application of a sixth voltage lower than the third voltage to the first interconnect while the second interconnect is in the floating state after being applied with the third voltage.

6. The memory device according to claim 1, wherein the read circuit is further configured to, in a case where the first voltage is higher than the second voltage:
  store an eighth voltage, the eighth voltage being a voltage of the second interconnect during application of a sixth voltage lower than the third voltage to the first interconnect while the second interconnect is in the floating state after being applied with the third voltage,
  write data in the first memory cell, and
  output data based on a comparison between the eighth voltage and a ninth voltage, the ninth voltage being a voltage of the second interconnect during application of the sixth voltage to the first interconnect while the second interconnect is in the floating state after being applied with the third voltage.

7. The memory device according to claim 1, further comprising:
  a third interconnect; and
  a second memory cell between the first interconnect and the third interconnect, the second memory cell comprising a second variable resistance element and a second switching element, and the second switching element being configured to transition from an ON state to an OFF state in response to a voltage applied between two terminals of the third interconnect being decreased,
  wherein the read circuit is further configured to:
    place the third interconnect in a floating state collaterally with the second interconnect, and
    apply the fourth voltage to the third interconnect while the second interconnect is in the floating state after being applied with the third voltage after collaterally placing the second interconnect and the third interconnect in the floating states.

8. The memory device according to claim 1, wherein the read circuit is further configured to:
  apply the fourth voltage to the second interconnect,
  apply the third voltage to the second interconnect after applying the fourth voltage to the second interconnect, and
  place the second interconnect in the floating state after applying the third voltage to the second interconnect.

9. The memory device according to claim 8, wherein the read circuit is further configured to apply the fourth voltage to the first interconnect during application of the third voltage to the second interconnect and while the second interconnect is in the floating state.

10. The memory device according to claim 8, wherein the read circuit is further configured to apply the fourth voltage to the first interconnect and then apply a sixth voltage lower than the third voltage to the first interconnect.

11. A memory device comprising:
  a first interconnect;
  a second interconnect;
  a first memory cell between the first interconnect and the second interconnect, the first memory cell comprising a first variable resistance element and a first switching element, and the first switching element being configured to transition from an ON state to an OFF state in response to a voltage applied between two terminals of the first switching element being decreased; and
  a read circuit configured to:
    place the second interconnect in a floating state,
    after placing the second interconnect in the floating state, and based on a comparison between a first voltage of the second interconnect at a time point of the first switching element becoming the OFF state and a second voltage, either output data based on a comparison between the first voltage and a third voltage or apply a fourth voltage to the second interconnect, apply a fifth voltage higher than the fourth voltage to the second interconnect, place the second interconnect in the floating state after applying the fifth voltage to the second interconnect, and apply a sixth voltage lower than the fifth voltage to the first interconnect while the second interconnect is in the floating state, wherein the first voltage is a voltage of the second interconnect during application of the sixth voltage to the first interconnect while the second interconnect is in the floating state.

12. The memory device according to claim 11, wherein the fifth voltage has a size to turn on the first switching element.

13. The memory device according to claim 11, further comprising:

a third interconnect; and a second memory cell between the first interconnect and the third interconnect, the second memory cell comprising a second variable resistance element and a second switching element, and the second switching element being configured to transition from an ON state to an OFF state in response to a voltage applied between two terminals of the third interconnect being decreased, wherein the read circuit is further configured to:

place the third interconnect in a floating state collaterally with the second interconnect, and output the data based on a comparison between the first voltage and the third voltage after concurrently placing the second interconnect and the third interconnect in the floating states.

14. A memory device comprising:

a first interconnect;

a second interconnect;

a first memory cell between the first interconnect and the second interconnect, the first memory cell comprising a first variable resistance element and a first switching element, and the first switching element being configured to transition from an ON state to an OFF state in response to a voltage applied between two terminals of the first switching element being decreased; and a read circuit configured to:

place the second interconnect in a floating state, after placing the second interconnect in the floating state, and based on a comparison between a first voltage of the second interconnect at a time point of the first switching element becoming the OFF state and a second voltage, either output data based on a comparison between the first voltage and a third voltage or apply a fourth voltage to the second interconnect, apply a fourth voltage to the second interconnect, apply a fifth voltage higher than the fourth voltage to the second interconnect after applying the fourth voltage to the second interconnect, and place the second interconnect in the floating state after applying the fifth voltage to the second interconnect.

15. The memory device according to claim 14, wherein the read circuit is further configured to apply the fourth voltage to the first interconnect during application of the fifth voltage to the second interconnect and while the second interconnect is in the floating state.

16. The memory device according to claim 13, wherein the read circuit is further configured to apply the fourth voltage to the first interconnect and then apply a sixth voltage lower than the fourth voltage to the first interconnect.

17. The memory device according to claim 11, wherein the third voltage has a size between a size of the first voltage in a case where the first variable resistance element has a first resistance and a size of the first voltage in a case where the first variable resistance element has a second resistance.

* * * * *